United States Patent
Arai et al.

(10) Patent No.: US 10,568,226 B2
(45) Date of Patent: Feb. 18, 2020

(54) ELECTRONIC CONTROL DEVICE AND METHOD FOR MANUFACTURING ELECTRONIC CONTROL DEVICE

(71) Applicant: HITACHI AUTOMOTIVE SYSTEMS, LTD., Hitachinaka-shi, Ibaraki (JP)

(72) Inventors: Satoshi Arai, Tokyo (JP); Yukio Sakigawa, Tokyo (JP); Shigeharu Tsunoda, Tokyo (JP); Masaru Kamoshida, Hitachinaka (JP); Shirou Oouchi, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 0 days.

(21) Appl. No.: 15/777,949

(22) PCT Filed: Oct. 7, 2016

(86) PCT No.: PCT/JP2016/079976
§ 371 (c)(1),
(2) Date: May 22, 2018

(87) PCT Pub. No.: WO2017/094353
PCT Pub. Date: Jun. 8, 2017

(65) Prior Publication Data
US 2018/0352670 A1    Dec. 6, 2018

(30) Foreign Application Priority Data

Nov. 30, 2015   (JP) .................. 2015-233565

(51) Int. Cl.
*H05K 5/06*      (2006.01)
*B29C 65/44*     (2006.01)
(Continued)

(52) U.S. Cl.
CPC ............. *H05K 5/065* (2013.01); *B29C 65/16* (2013.01); *B29C 65/44* (2013.01);
(Continued)

(58) Field of Classification Search
CPC .... H05K 5/065; B29C 65/16; B29C 65/1629; B29C 65/1661; B29C 65/44;
(Continued)

(56) References Cited

U.S. PATENT DOCUMENTS 9,778,086 B2 * 10/2017 Arai ...................... G01F 15/14
2015/0192446 A1    7/2015 Arai et al.

FOREIGN PATENT DOCUMENTS

CN      104364620 A     2/2015
CN      104968483 A    10/2015
(Continued)

OTHER PUBLICATIONS

English translation of JP 2014-46599 A dated Mar. 17, 2014, translated on Mar. 31, 2019 (Year: 2019).*

(Continued)

*Primary Examiner* — James Wu
*Assistant Examiner* — Hung Q Dang
(74) *Attorney, Agent, or Firm* — Mattingly & Malur, PC

(57) ABSTRACT

It is provided an electronic control device including a resin molded body, a metal body, and an electronic component, wherein the resin molded body and a main surface of the metal body are bonded, and at least a part of a side surface continuous to the main surface of the metal body is in contact with a side contact portion provided in the resin molded body.

8 Claims, 15 Drawing Sheets

(51) Int. Cl.
*B29C 65/82* (2006.01)
*B29C 65/00* (2006.01)
*B29C 65/16* (2006.01)
*H05K 5/00* (2006.01)
*H05K 7/20* (2006.01)
*B29L 31/34* (2006.01)
*B29K 701/12* (2006.01)
*H05K 5/02* (2006.01)

(52) U.S. Cl.
CPC ........ *B29C 65/8223* (2013.01); *B29C 66/026* (2013.01); *B29C 66/028* (2013.01); *B29C 66/1248* (2013.01); *B29C 66/742* (2013.01); *H05K 5/0017* (2013.01); *H05K 7/2039* (2013.01); *H05K 7/20854* (2013.01); *B29K 2701/12* (2013.01); *B29L 2031/3481* (2013.01); *H05K 5/0247* (2013.01)

(58) Field of Classification Search
CPC ............ B29C 65/8223; B29C 66/0246; B29C 66/026; B29C 66/028; B29C 66/112
See application file for complete search history.

(56) References Cited

FOREIGN PATENT DOCUMENTS

| | | | |
|---|---|---|---|
| EP | 3 205 480 A1 | 8/2017 | |
| JP | 2010-76437 A | 4/2010 | |
| JP | 2014-46599 A * | 3/2014 | ......... B29C 65/1616 |
| JP | 2015-63090 A | 4/2015 | |
| WO | 2013/154037 A1 | 10/2013 | |
| WO | WO-2013186926 A1 * | 12/2013 | ............. G01F 15/14 |
| WO | WO-2014123022 A1 * | 8/2014 | ........... B29C 66/652 |

OTHER PUBLICATIONS

International Search Report of PCT/JP2016/079976 dated Nov. 15, 2016.
Extended European Search Report received in corresponding European Application No. 16870293.4 dated Jun. 12, 2019.
Chinese Office Action received in corresponding Chinese Application No. 201680058831.1 dated Aug. 2, 2019.

* cited by examiner

FIG.5
(a) 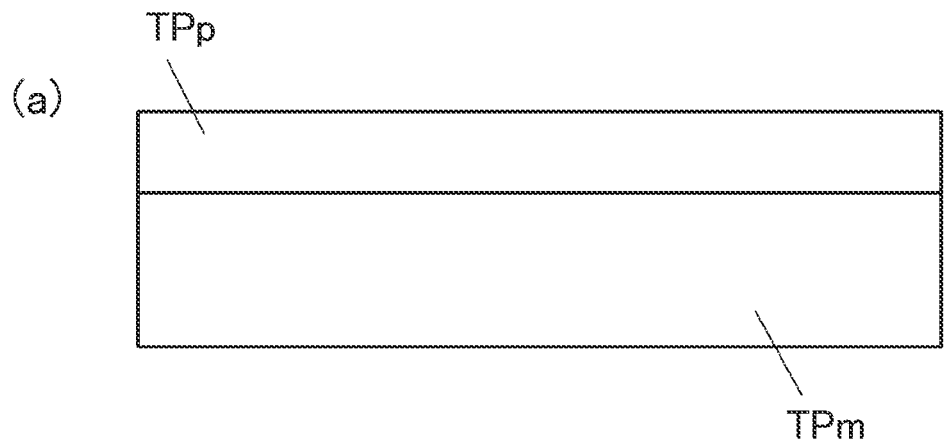
(b) 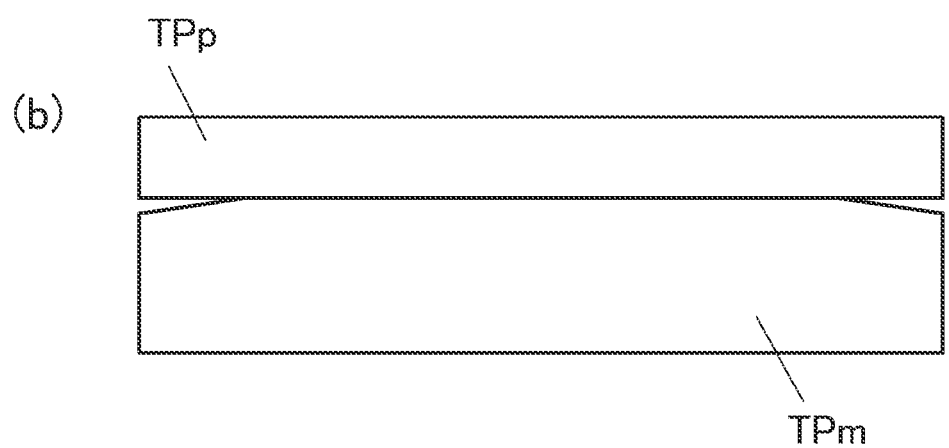
(c) 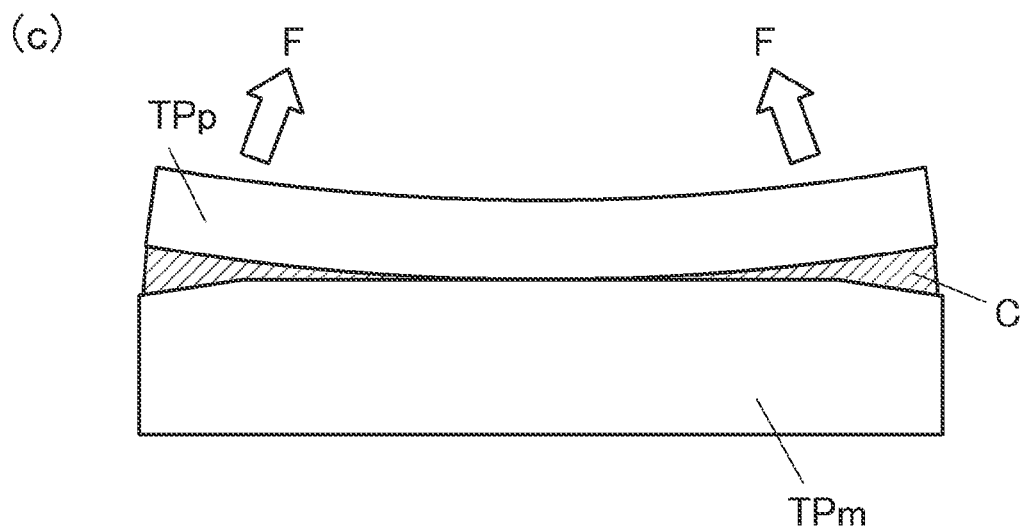

FIG.8
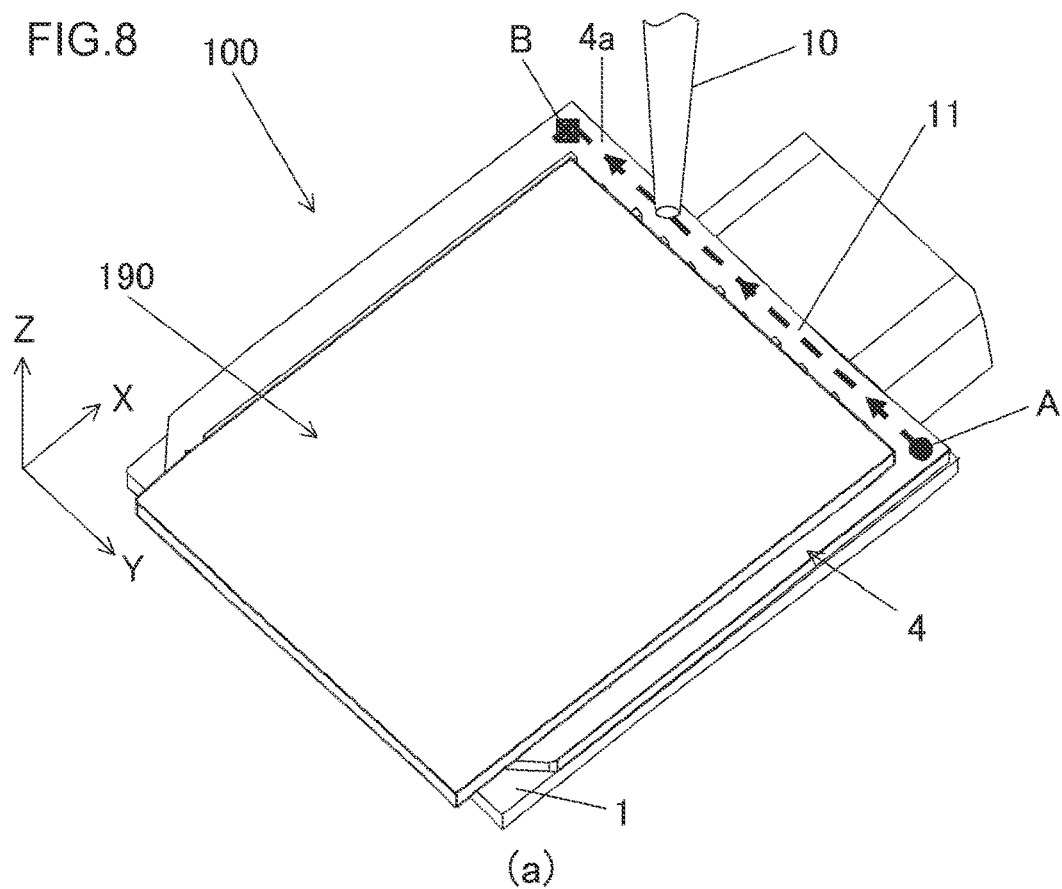
(a)
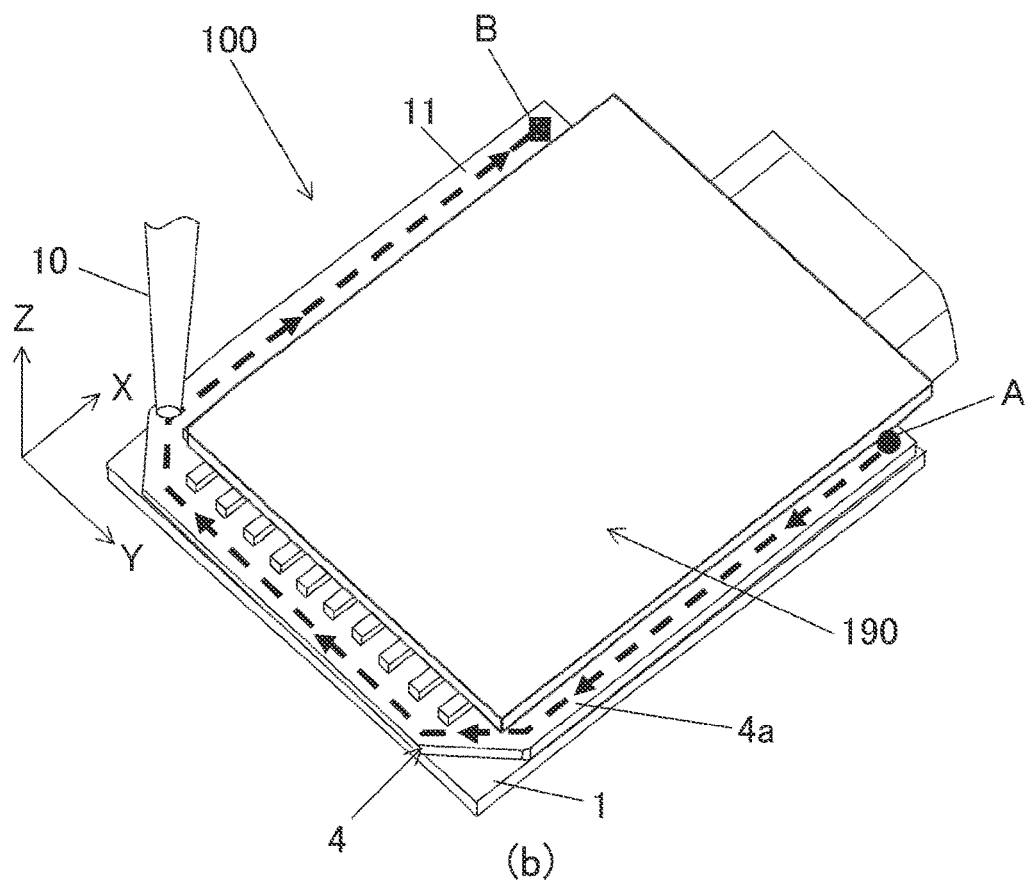
(b)

FIG.9
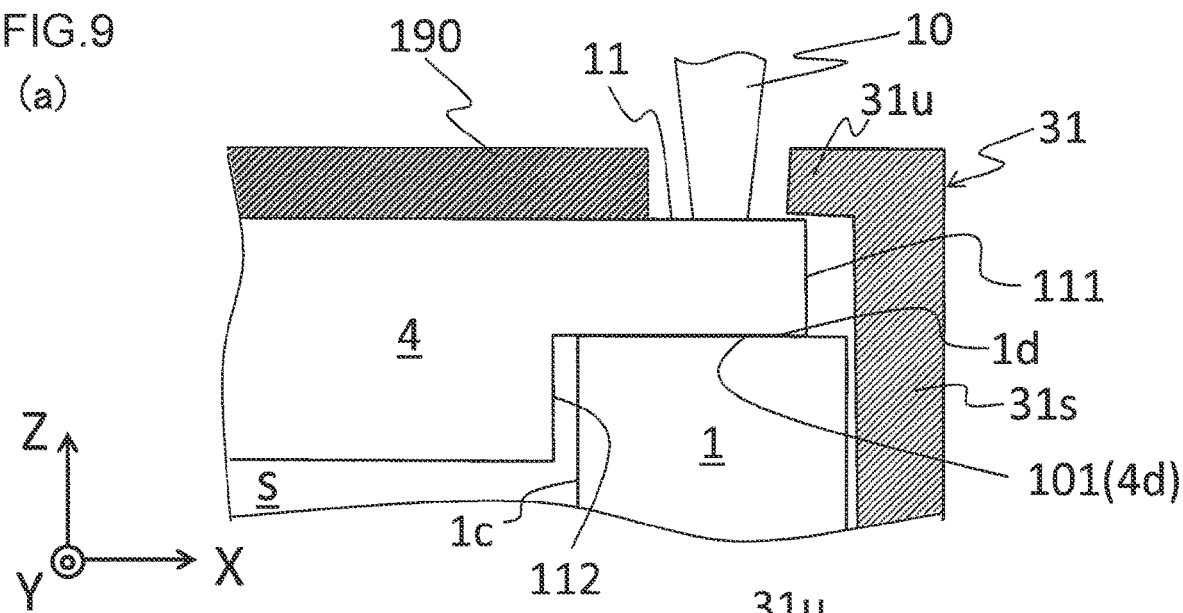
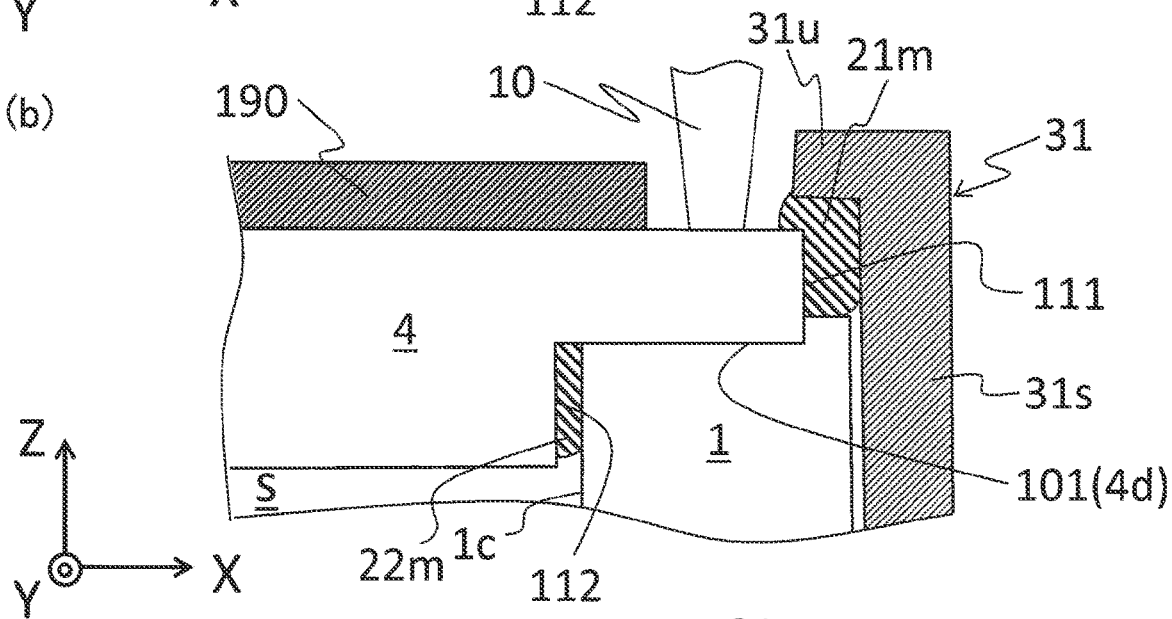
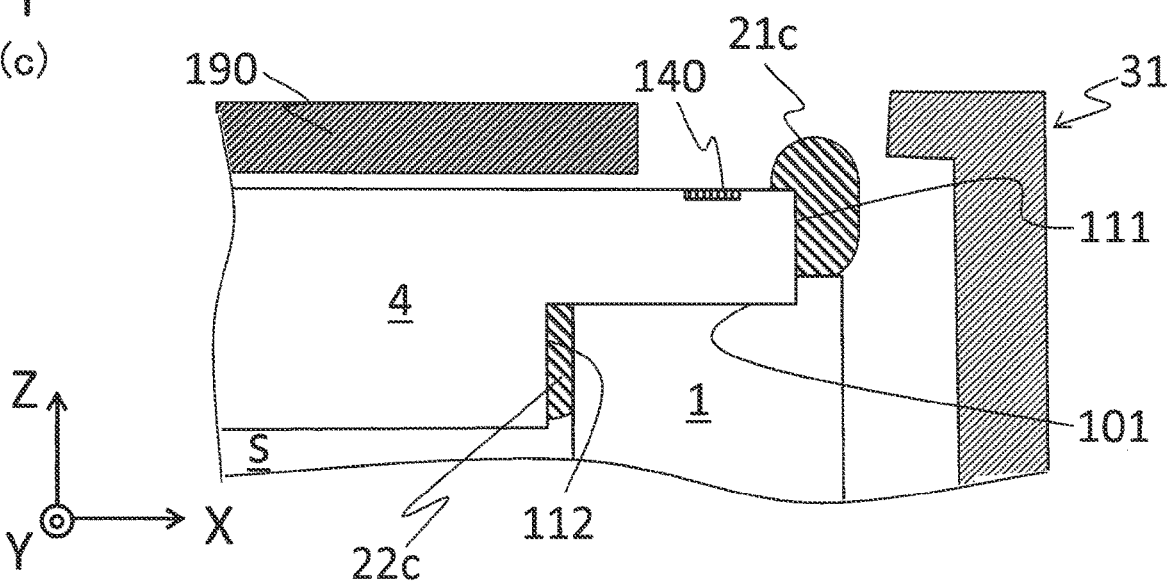

FIG.10
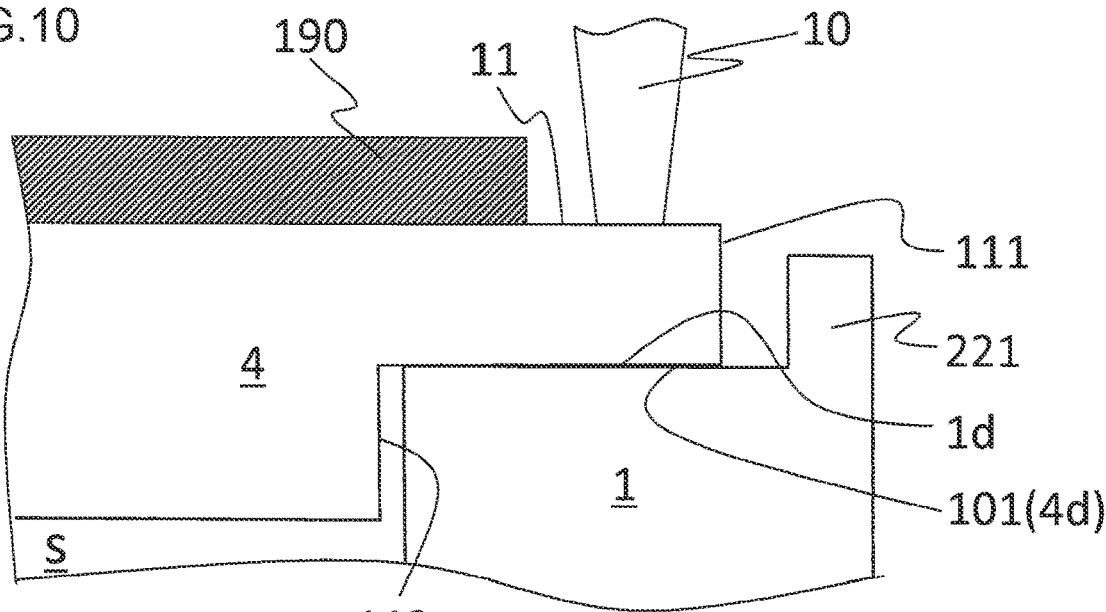
(a)
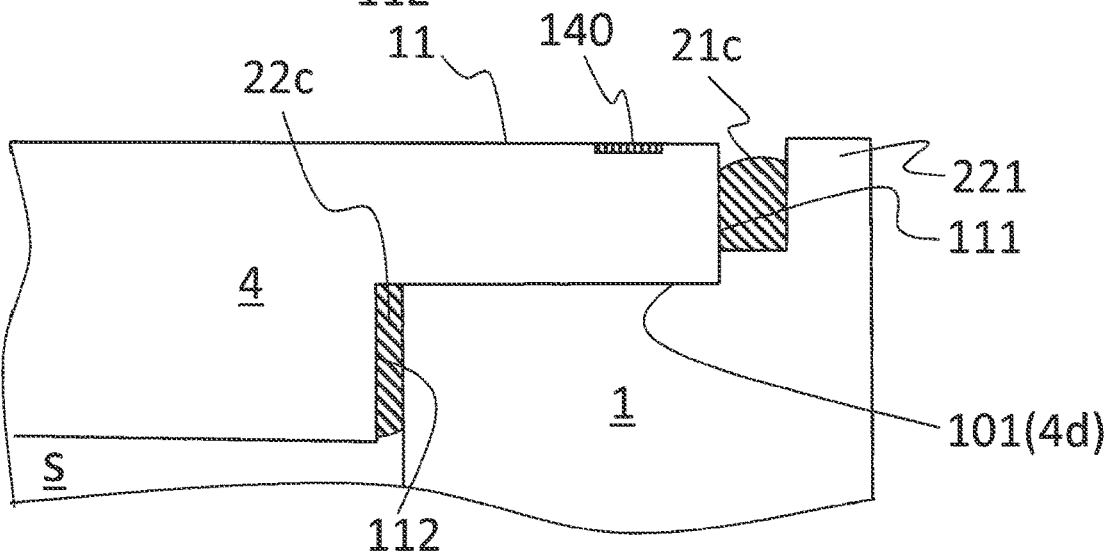
(b)
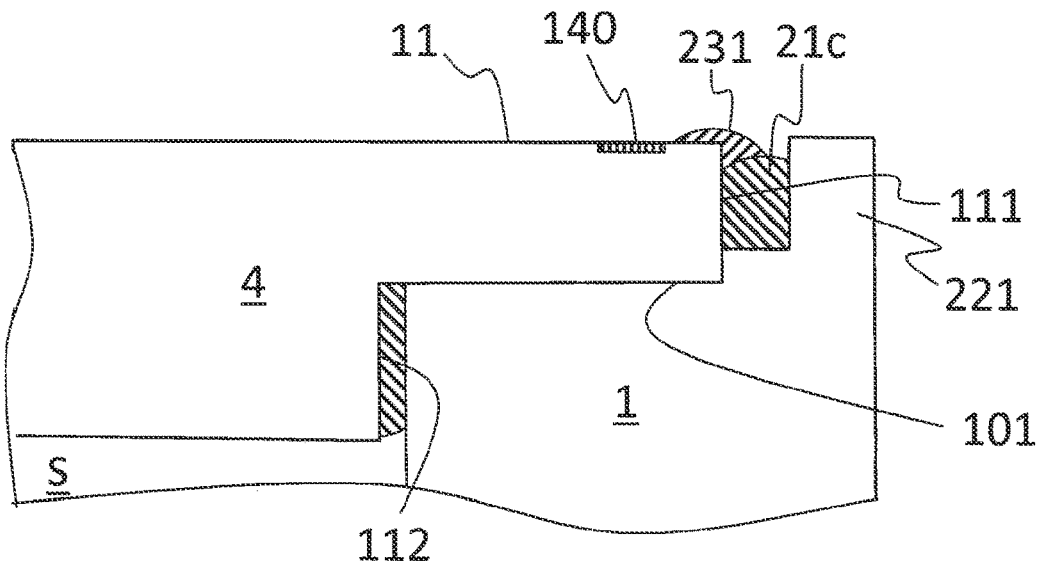
(c)

FIG.12
(a)
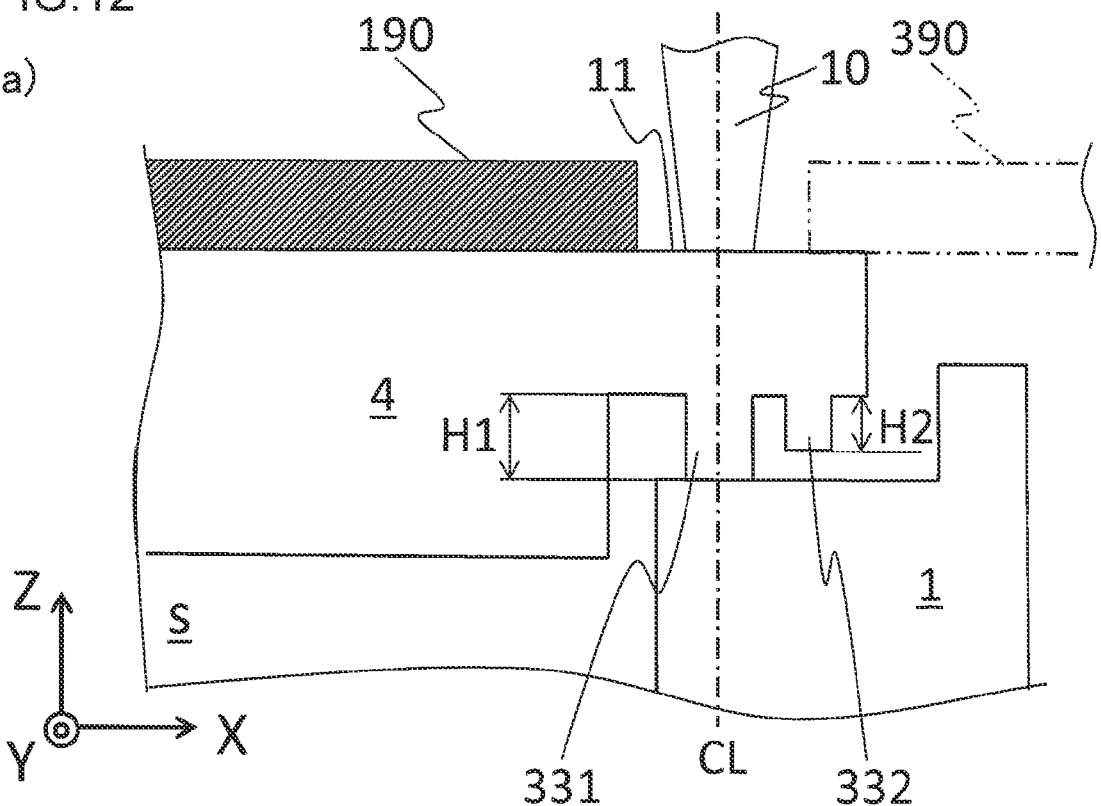
(b)
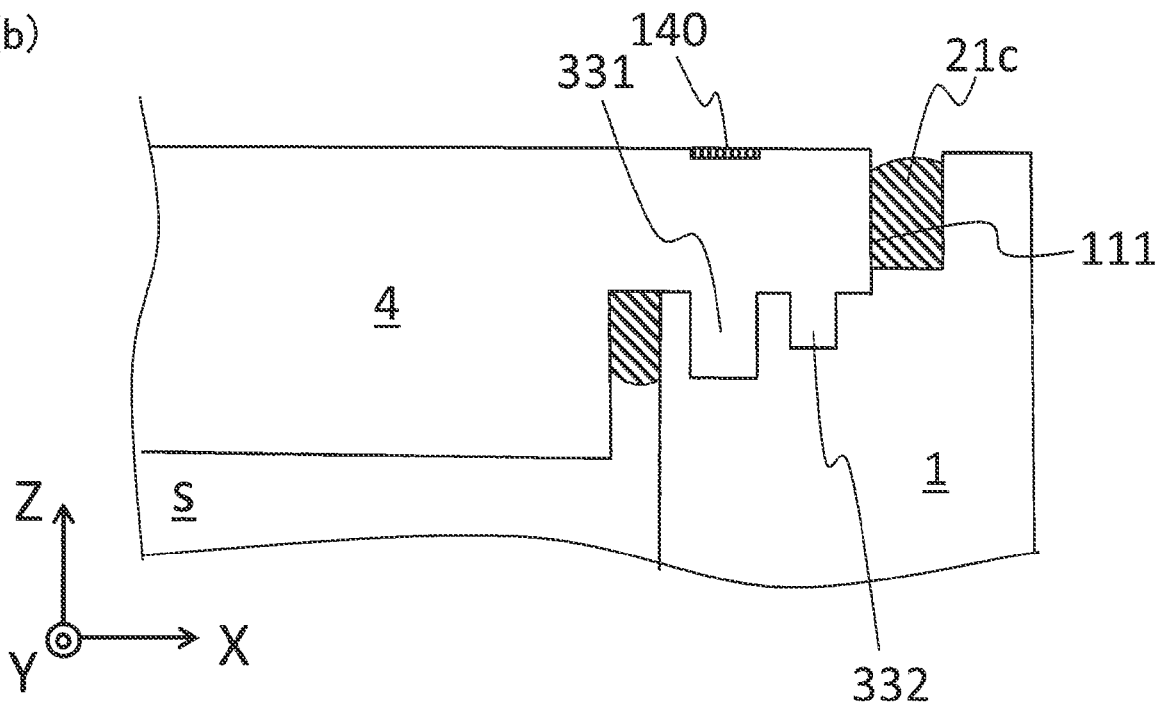

FIG.13
(a)
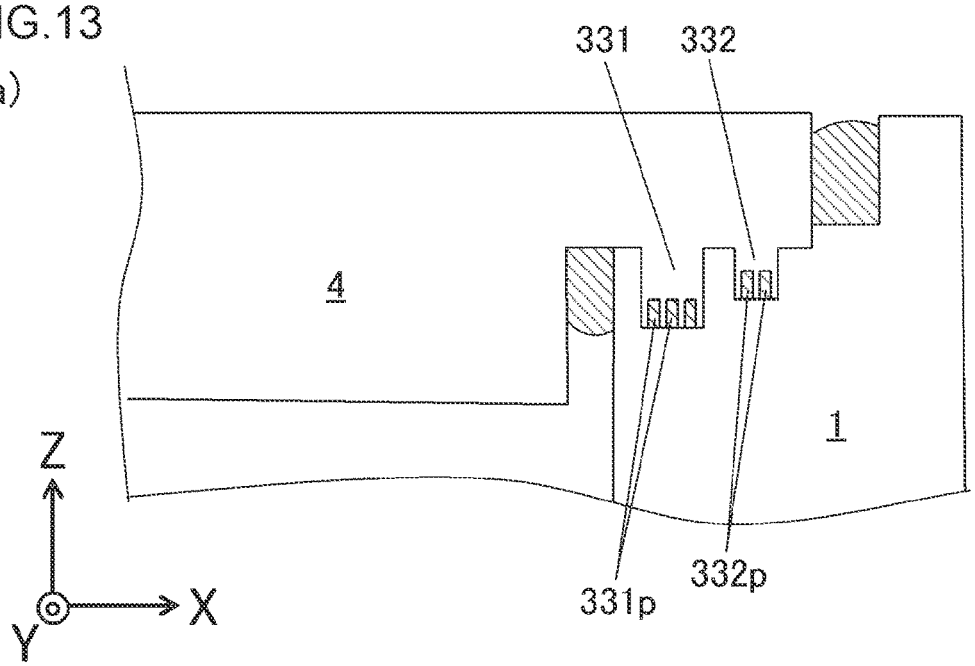
(b)
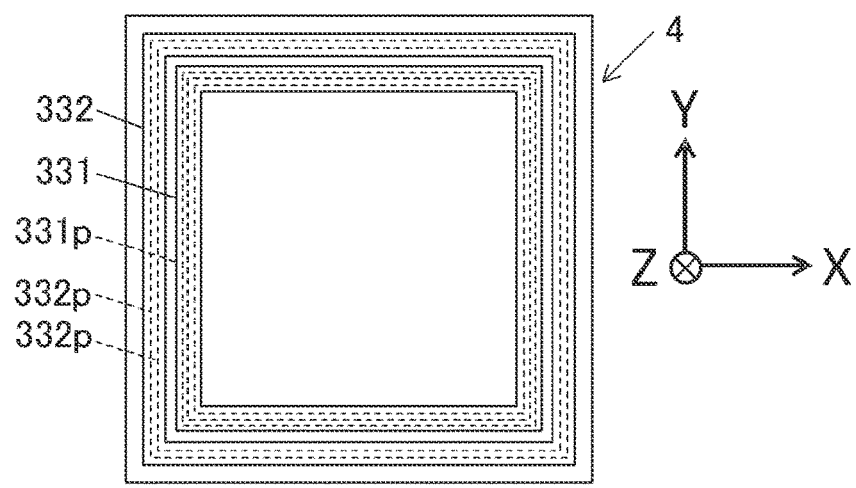
(c)
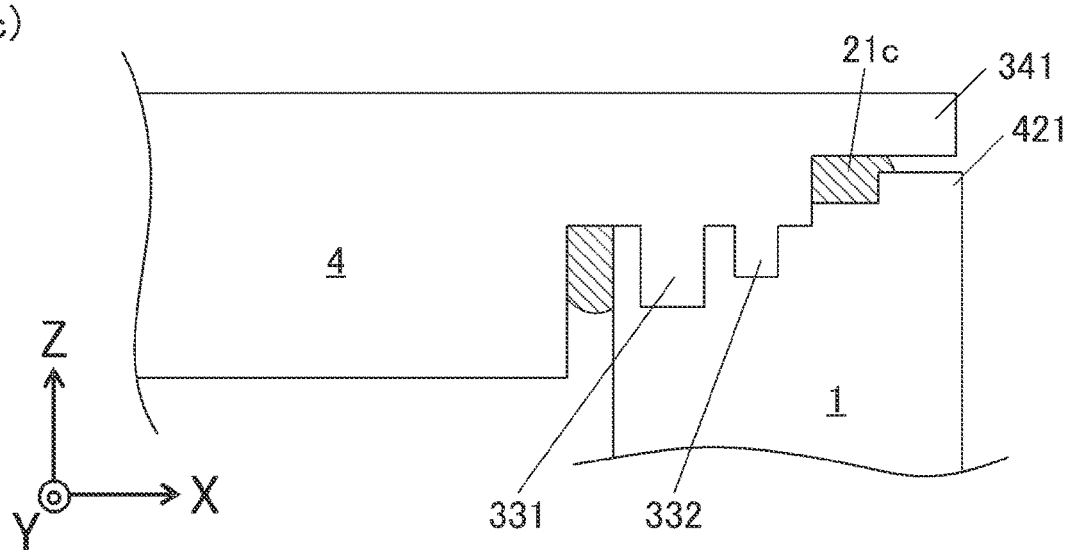

FIG.14
(a)
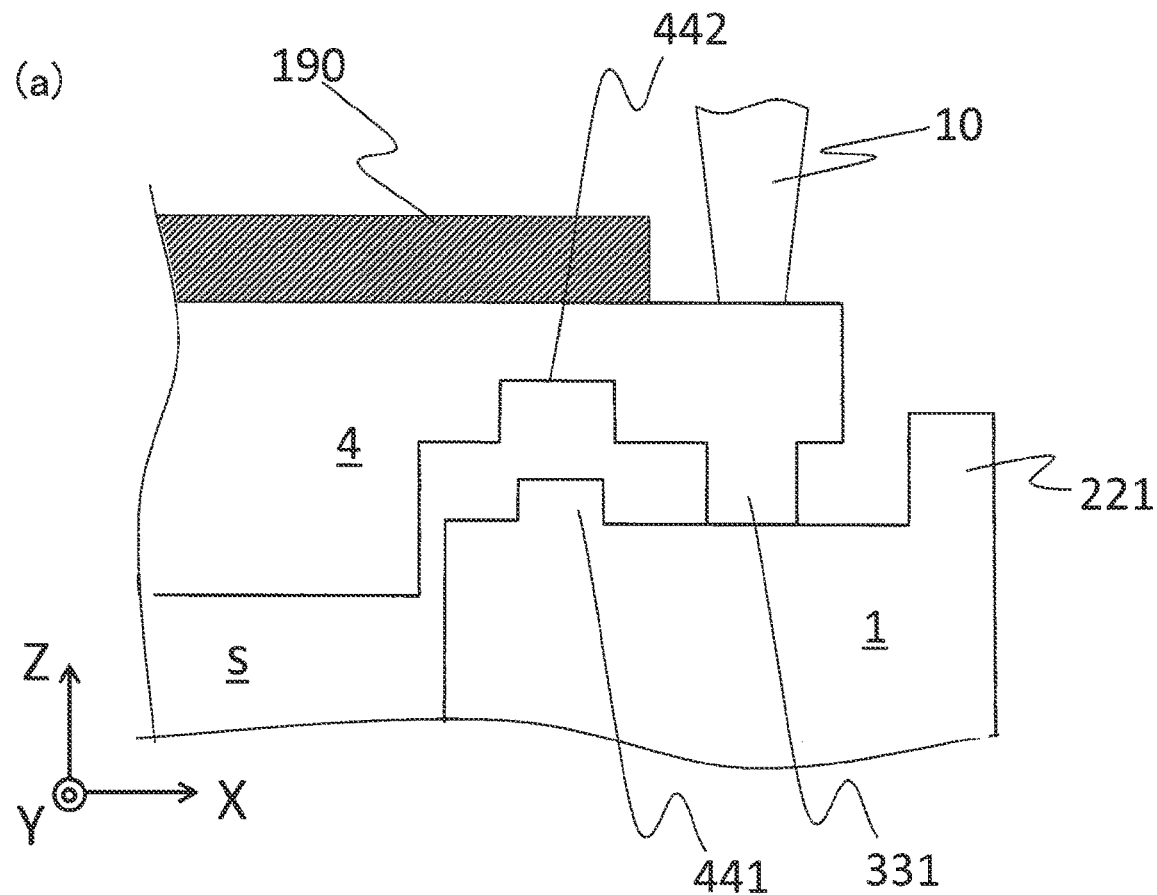
(b)
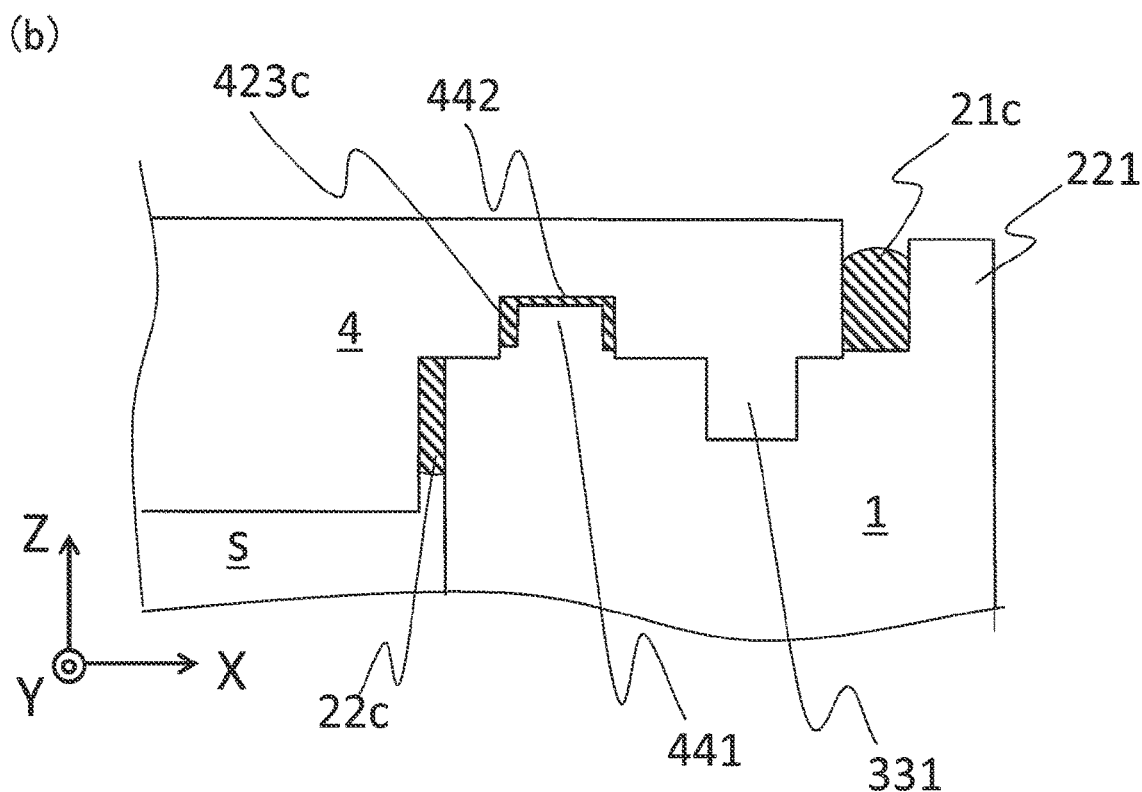

FIG.15
(a)
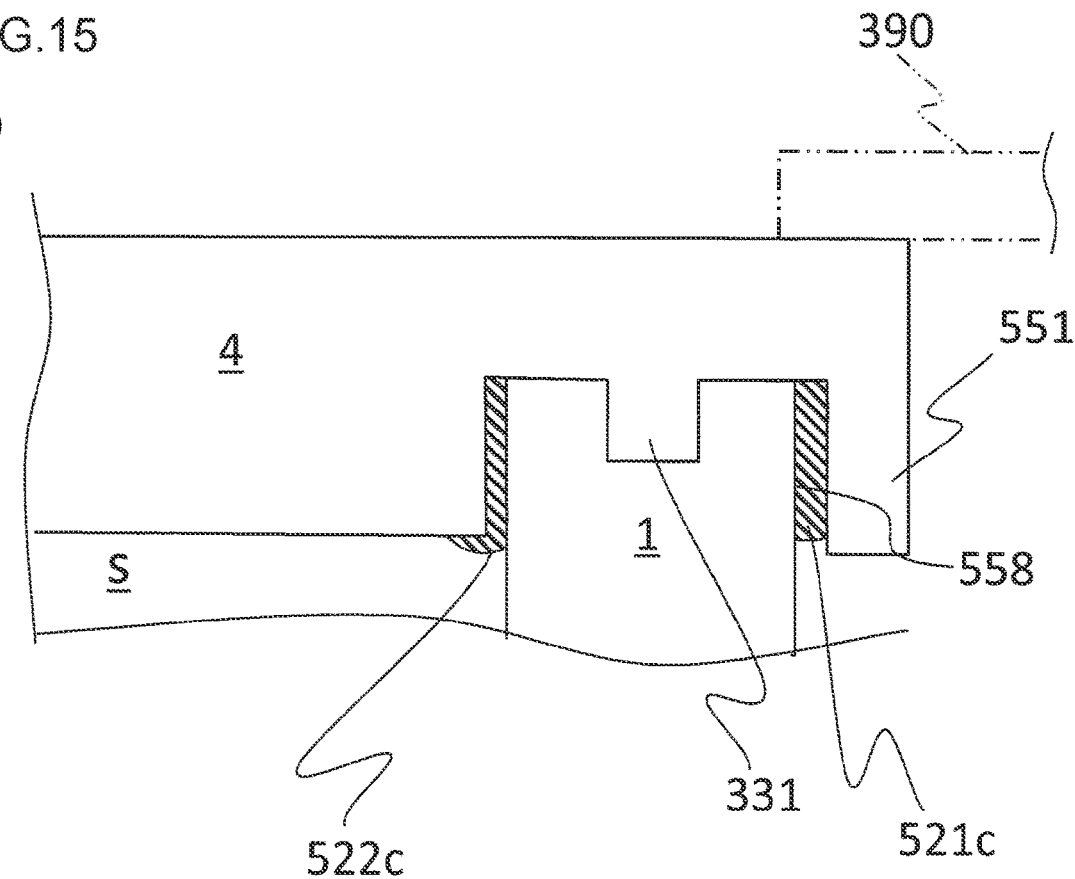
(b)
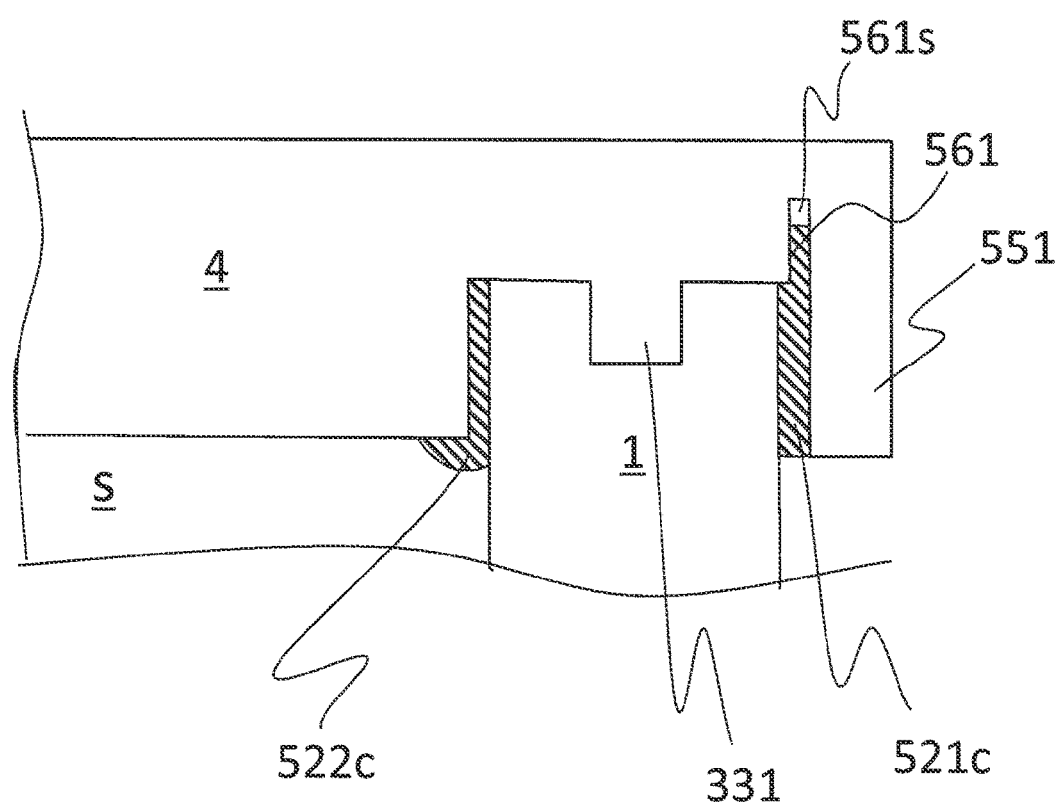

ELECTRONIC CONTROL DEVICE AND METHOD FOR MANUFACTURING ELECTRONIC CONTROL DEVICE

TECHNICAL FIELD

The present invention relates to an electronic control device and a method for manufacturing an electronic control device.

BACKGROUND ART

It is known a method for producing a composite of a resin molded body and a metal body, wherein the resin molded body and the metal body are overlapped and bonded by irradiating with a laser beam from the metal body side and softening and/or melting at least a part of the resin molded body (see Patent Literature 1).

CITATION LIST

Patent Literature

[PTL 1] JP-A-2010-76437

SUMMARY OF INVENTION

Technical Problem

The inventors have found the following problems as a result of intensive studies.

When a bonded structure formed by overlapping and bonding a resin molded body and a metal body on one plane is placed in a salt damage environment, the metal body is corroded by salt damage, a gap is formed at the bonding portion between the resin molded body and metal body, and a corroded substance is generated at this part due to crevice corrosion. The corroded substance generated in the gap grows as time passes, and the gap between the resin molded body and the metal body is expanded. At the same time, a force (peeling force) tending to peel the resin molded body from the metal body is generated, and thus the resin molded body and the metal body may be separated.

Solution to Problem

According to a first form of the invention, in an electronic control device including a resin molded body, a metal body, and an electronic component, the resin molded body and a main surface of the metal body are bonded together, and at least a part of a side surface continuous to the main surface of the metal body is in contact with a side contact portion provided in the resin molded body.

According to a second form of the invention, in a method for manufacturing an electronic control device including a resin molded body, a metal body and an electronic component, the electronic component is arranged in a housing space defined by the resin molded body and the metal body, a surface opposite to the main surface is irradiated with a laser beam in a state where the resin molded body and the main surface of the metal body are pressed into contact with each other, the resin molded body is deformed by heat from the laser beam and a deformed portion of the resin molded body is brought into contact with a part of a side surface continuous to the main surface of the metal body.

Advantageous Effects of Invention

According to the invention, separation of the resin molded body and the metal body can be inhibited when a bonded structure formed by bonding a resin molded body and a metal body is placed in a salt damage environment.

BRIEF DESCRIPTION OF DRAWINGS

FIG. 5 is a schematic vie showing a process of peeling a resin sheet from a metal sheet.

FIG. 8 is a perspective view schematically showing a procedure of scanning a laser beam in a state where a metal base is pressed against a resin molded body by a pressing jig.

FIG. 9 is a schematic cross-sectional view illustrating a bonding method according to a first embodiment.

FIGS. 10 (a) and (b) are schematic cross-sectional views illustrating a bonding method according to a second embodiment, and (c) is a schematic cross-sectional view illustrating a bonding method according to a variation of the second embodiment.

FIG. 12 is a schematic cross-sectional view illustrating a bonding method according to variation 1 and variation 2 of the third embodiment.

FIG. 13 (a) is a schematic cross-sectional view illustrating a bonding method according to variation 3 of the third embodiment, (b) is a schematic plan view of a metal base 4 according to variation 3 of the third embodiment, and (c) is a schematic cross-sectional view illustrating a bonding method according to variation 4 of the third embodiment.

FIG. 14 is a schematic cross-sectional view illustrating a bonding method according to a fourth embodiment.

FIG. 15 (a) is a schematic cross-sectional view illustrating a bonding method according to a fifth embodiment, and (b) is a schematic cross-sectional view illustrating a bonding method according to a variation of the fifth embodiment.

DESCRIPTION OF EMBODIMENTS

Embodiments of the invention will be described below with reference to the drawings.

First Embodiment

Figure 1:
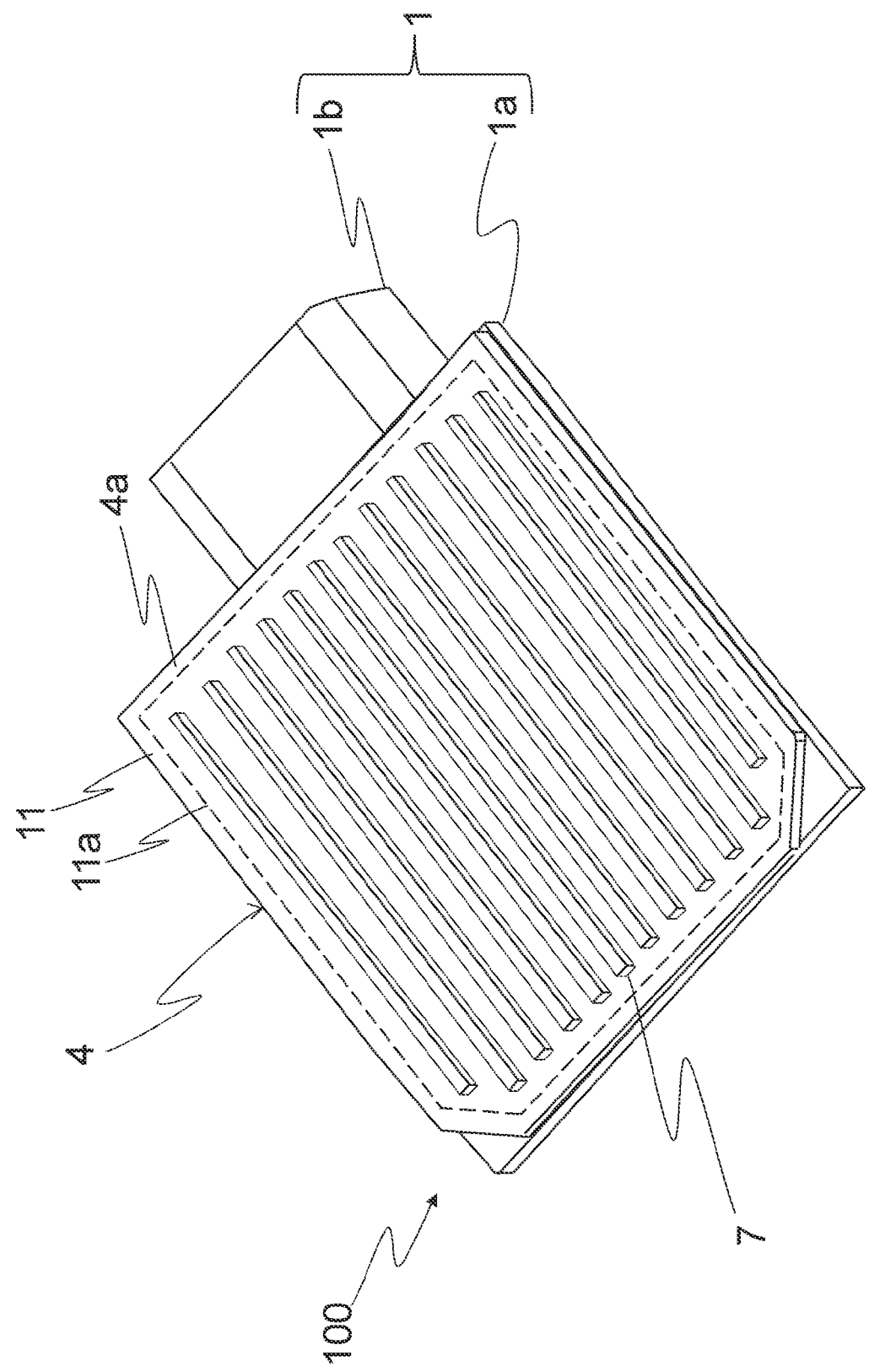
FIG. 1 is a perspective view schematically showing an electronic control device.
Figure 2:
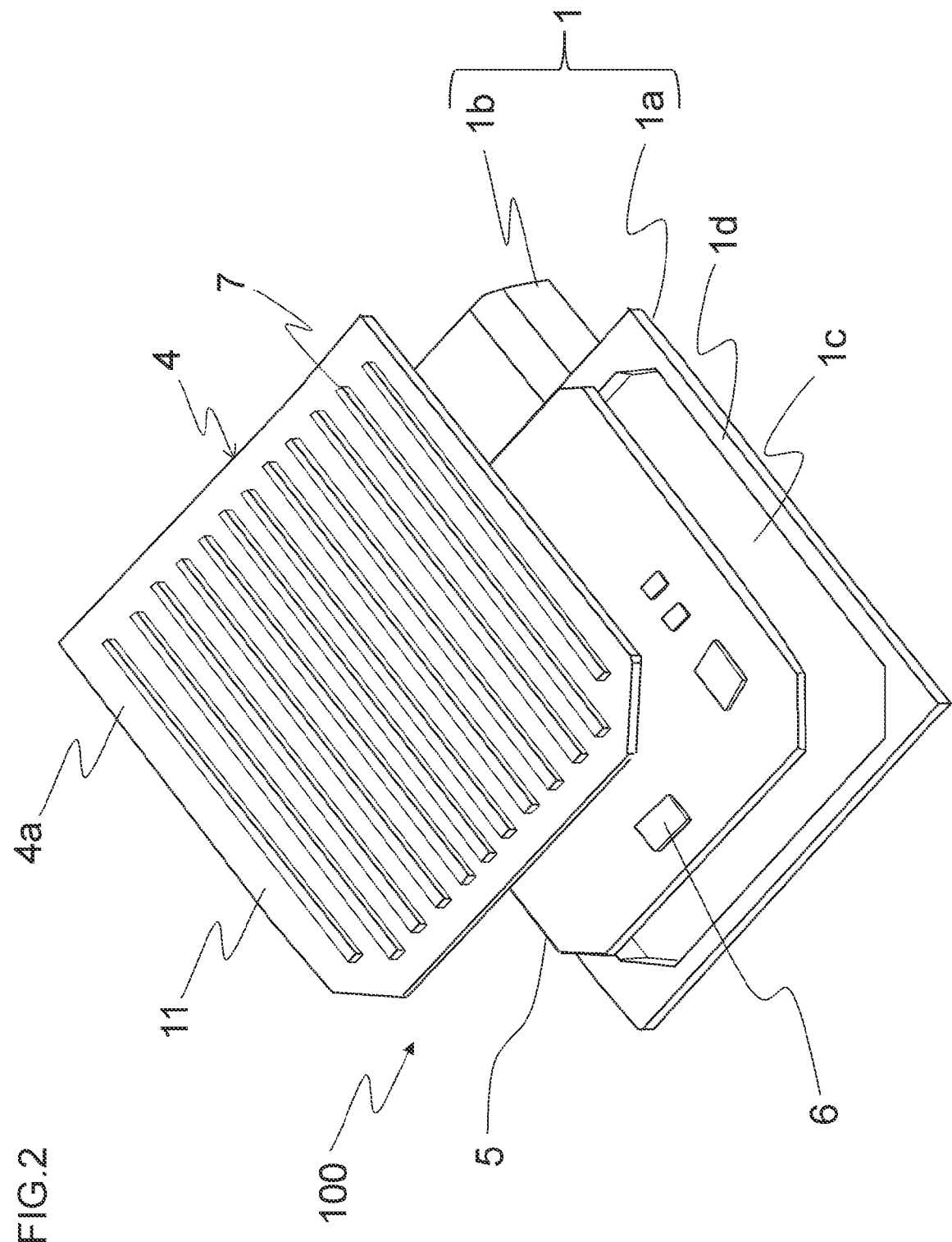
FIG. 2 is a disassembled perspective view schematically showing an electronic control device.

FIG. 1 is a perspective view schematically showing an electronic control device 100 according to an embodiment of the invention, and FIG. 2 is a disassembled perspective view schematically showing the electronic control device 100. The electronic control device 100 according to the present embodiment is an engine controller unit (ECU) installed in an automobile and electronically controlling an engine. As shown in FIG. 2, the electronic control device 100 includes a circuit substrate 5 for engine control, a resin molded body 1, and a metal base 4.

The resin molded body 1 includes a cover 1a which covers the circuit substrate 5 arranged on the metal base 4, and a connector 1b for exchanging signals between the circuit substrate 5 and external devices (various sensors, actuators, etc.). The resin molded body 1 is formed with a polymer alloy which is a thermoplastic resin composition alloyed by containing a thermoplastic crystalline resin and a thermoplastic non-crystalline resin, and is an integrally molded body in which the cover 1a and the connector 1b are integrally molded by injection molding.

A terminal pin (now shown) electrically connected to the circuit substrate 5 is insert-molded in the connector 1b, and the terminal pin (not shown) is held by the connector 1b. The cover 1a is provided with a recessed portion 1c in which the circuit substrate 5 is arranged. The opening peripheral portion of the recessed portion 1c of the cover 1a is a bonding surface (hereinafter referred to as a resin bonding surface 1d) in contact with the edge (outer peripheral portion) of the metal base 4, and is formed as a flat surface.

By laser bonding to the resin molded body 1 such that the metal base 4 fills up the recessed portion 1c of the cover 1a, the opening of the recessed portion 1c is closed by the metal base 4, and a housing space housing the circuit substrate 5 is defined by the recessed portion 1c and the metal base 4. On the circuit substrate 5, a plurality of electronic components 6 for engine control are mounted and a predetermined wiring pattern is formed, thereby forming an electronic circuit portion.

The metal base 4 has a function as a radiator that radiates heat generated by the electronic components 6 of the circuit substrate 5 to the open air. The metal base 4 is formed with aluminum die-cast into a rectangular flat plate shape, and a plurality of cooling fins 7 are formed in parallel to each other. For the material of the metal base 4, for example, a generally used material is used, and it is preferable to use JIS ADC 12 which is available at low cost.

The edge (outer peripheral portion) of the metal base 4 is a connecting portion 4a to be bonded by a laser bonding step which will be described later. One surface of the connecting portion 4a of the metal base 4 is a bonding surface (hereinafter referred to as a metal bonding surface 4d (see FIG. 9)) which contacts the resin bonding surface 1d of the resin molded body 1, and is formed as a flat surface. The other surface of the connecting portion 4a of the metal base 4, that is, the surface opposite to the metal bonding surface 4d, is a laser irradiation surface 11 to be irradiated with a laser beam. The laser irradiation surface 11 is a flat surface for uniform laser irradiation.

The width of a laser bonding portion 11a (see the broken lines in FIG. 1) formed by the laser bonding which will be described later is preferably at least 1 mm or more from the viewpoint of sealing performance by the laser bonding portion 11a. Therefore, the width of the laser irradiation surface 11 is set to a size such that the width of the laser bonding portion 11a can be ensured to be at least 1 mm or more.

Considering salt damage resistance, the thickness of the connecting portion 4a of the metal base 4 is preferably about 2 to 4 mm. The surface roughness of the laser irradiation surface 11 is decided in consideration of manufacturing cost. Generally, comparing with a case where the surface roughness is small, when the surface roughness becomes larger, reflectivity decreases due to an effect of scattering and laser energy required for bonding can be reduced. Therefore, it is possible to reduce the manufacturing cost by setting laser output low at the time of laser bonding and shorten a manufacturing process by setting a scanning speed of the laser beam high. The surface roughness of the metal base 4 can be increased by blasting treatment or treatment with a chemical liquid. In addition, from the viewpoint of increasing absorption rate, an alumite treatment may also be applied besides increasing the roughness.

It is preferable to perform blasting treatment and the like not only on the laser irradiation surface 11 but also on the metal bonding surface 4d including a side surface of the metal base 4. In this way, an adhesion to the resin melted due to heat can be improved, that is, a contact area can be increased. As an average surface roughness Ra of the metal bonding surface 4d, 0.1 to 7.0 μm is an appropriate range in consideration of the improvement of bonding strength only. When the surface roughness Ra of the metal bonding surface 4d is less than 0.1 μm, the effect of improvement of the bonding strength is small and there is a risk of peeling off, and thus the surface roughness Ra of the metal bonding surface 4d is preferably 0.1 μm or more. It is still possible to bond the resin molded body 1 and the metal base 4 by performing a plasma treatment before the laser bonding even when the surface roughness Ra is less than 0.1 μm. When the surface roughness Ra of the metal bonding surface 4d is more than 7.0 μm, the fine unevenness of the metal bonding surface 4d cannot be sufficiently filled with the resin and the bonding strength decreases. Therefore, the surface roughness Ra of the metal bonding surface 4d is preferably 7.0 μm or less, and more preferably 5.0 μm or less from the viewpoint of airtightness.

Figure 3:
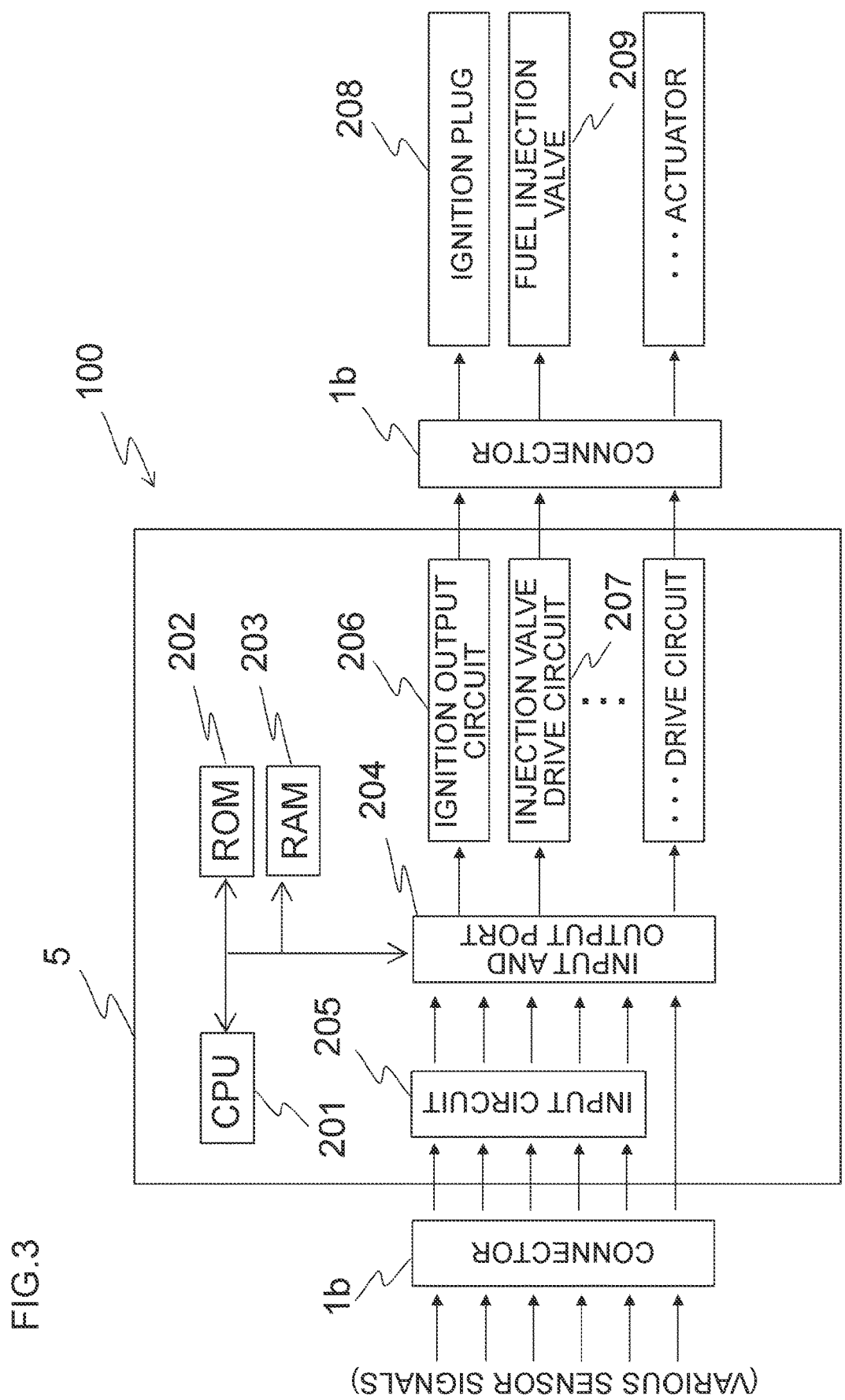
FIG. 3 is a functional block diagram of an electronic control device.

FIG. 3 is a functional block diagram of the electronic control device 100. As shown in FIG. 3, the circuit substrate 5 includes a CPU 201, a ROM 202, a RAM 203 and an input and output port 204 which are bus connected with each other, an input circuit 205, and a drive circuit which controls operations of various actuators.

Detection signals from various sensors such as a crank angle sensor and a water temperature sensor are input to the input circuit 205 via a terminal of the connector 1b. The drive circuit includes an ignition output circuit 206 which outputs a drive control signal to an ignition plug 208 at a predetermined timing via the terminal of the connector 1b, and an injection valve drive circuit 207 which outputs a drive control signal to a fuel injection valve 209 at a predetermined timing via the terminal of the connector 1b.

In an electronic control device on which vibration or impact acts, such as the electronic control device 100 installed in an automobile, it is important to maintain a certain bonding strength between the resin molded body 1 and the metal base 4 over a long period of time. The inventors conducted a salt damage test on a bonded structure obtained by bonding the resin molded body 1 and the metal base 4.

Figure 4:
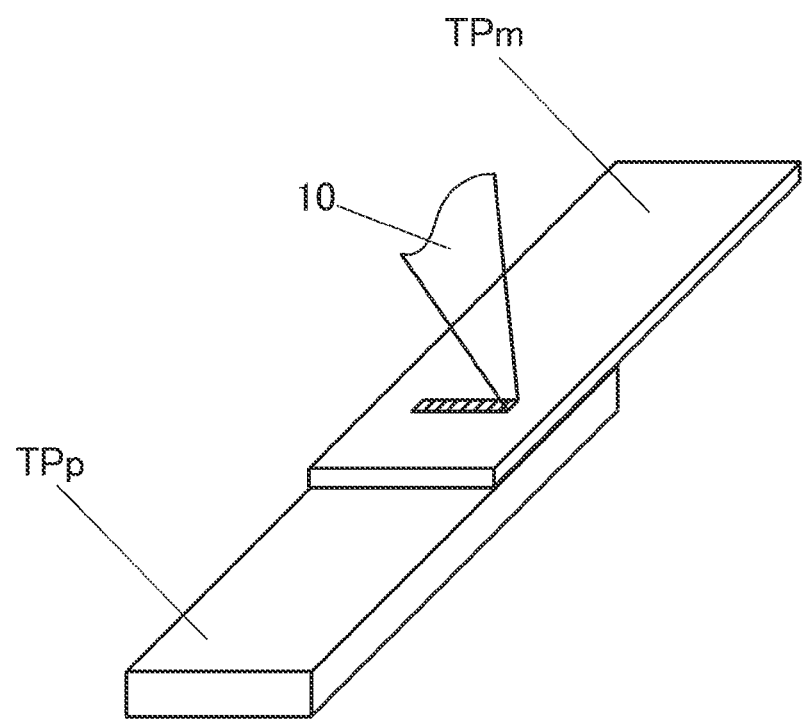
FIG. 4 is a diagram illustrating laser bonding of a resin sheet and a metal sheet.

FIG. 4 is a diagram illustrating laser bonding of a resin sheet TPp and a metal sheet TPm. As shown in FIG. 4, a laser bonded structure obtained by laser bonding the resin sheet TPp and the metal sheet TPm was used in the salt damage test. Each of the resin sheet TPp and the metal sheet TPm is in a rectangular flat plate shape with a length of 70 mm, a width of 10 mm, and a thickness of 2 mm.

At the time of laser bonding, the resin sheet TPp and the metal sheet TPm are overlapped in a region of 20 mm square and a pressure is applied from the outside such that the resin sheet TPp and the metal sheet TPm are pressed into contact with each other. The metal sheet TPm is irradiated with a laser beam 10 in a state where the resin sheet TPp and the metal sheet TPm are pressed into contact with each other, and the resin sheet TPp and the metal sheet TPm are laser-bonded. The resin sheet TPp and the metal sheet TPm are bonded on one plane. A semiconductor laser device was used for the laser device.

A step of spraying salt water on a test sheet, a drying step of drying the test sheet, a wetting step and the like are repeated in the salt damage test. The following was found in observing the cross section of the bonding portion between the resin sheet TPp and the metal sheet TPm.

FIG. 5 is a schematic view showing a process of peeling the resin sheet TPp from the metal sheet TPm. For convenience of explanation, a gap between the resin sheet TPp and the metal sheet TPm and a deformation amount of the resin sheet TPp are exaggerated for illustration in FIG. 5. As shown in FIG. 5 (a), in a laser bonded structure before the salt damage test, there was no gap in the bonding portion and the resin sheet TPp and the metal sheet TPm were closely adhered to each other. In other words, there was no gap between the resin sheet TPp and the metal sheet TPm. When the salt damage test was conducted, as shown in FIG. 5 (b), the outer peripheral portion of the metal sheet TPm was corroded, a gap was formed between the resin sheet TPp and the metal sheet TPm and a corroded substance C was generated in the gap. Further, as shown in FIG. 5 (c), it was confirmed that the corroded substance C grew due to crevice corrosion as the salt damage test was conducted. As the corroded substance C grows and accumulates, a pressing force (hereinafter referred to as a peeling force F) acts on the resin sheet TPp so as to separate the metal sheet TPm from the resin sheet TPp, and the separation of the resin sheet TPp from the metal sheet TPm proceeds gradually from the outer peripheral portion towards the inner side. As a result, the resin sheet TPp is deformed to warp and a force tending to separate the resin sheet TPp and the metal sheet TPm also acts on the central bonding portion. Further, as the corrosion proceeded, the bonding area of the laser bonded structure of the resin sheet TPp and the metal sheet TPm was filled with the corroded substance, and the resin sheet TPp and the metal sheet TPm were completely separated. In other words, the resin sheet TPp was peeled off from the metal sheet TPm by the salt damage test.

As such, the inventors has discovered a peeling mechanism in a case where the resin sheet TPp and the metal sheet TPm were bonded on one plane and has found that it is important to control the direction of the peeling force generated in order to prevent peeling caused by the growth of the corroded substance. A configuration and a manufacturing method of a bonded structure for controlling the direction of the peeling force and maintaining a high bonding strength over a long period of time will be specifically described below.

Figure 6:
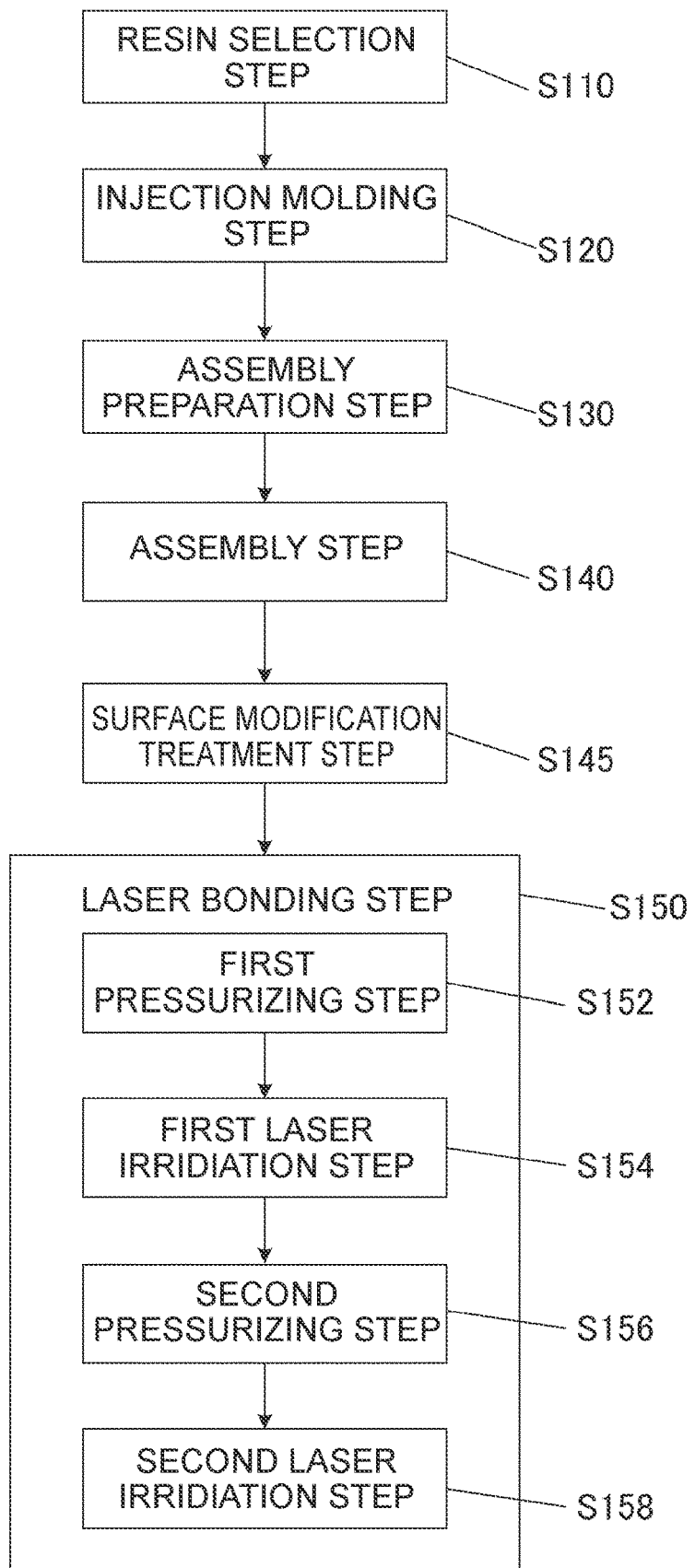
FIG. 6 is a flow chart for illustrating steps of manufacturing an electronic control device.

FIG. 6 is a flow chart for illustrating steps of manufacturing the electronic control device 100. The method for manufacturing the electronic control device 100 includes a resin selection step S110, an injection molding step S120, an assembly preparation step S130, an assembly step S140, a surface modification treatment step S145 and a laser bonding step S150.

—Resin Selection Step—

In the resin selection step S110, a crystalline resin and a non-crystalline resin to be alloyed are selected. In the selection, a crystalline resin and a non-crystalline resin are respectively selected so as to satisfy the following selection condition. The selected crystalline resin and non-crystalline resin are alloyed and form a pellet-shaped polymer alloy.

Figure 7:
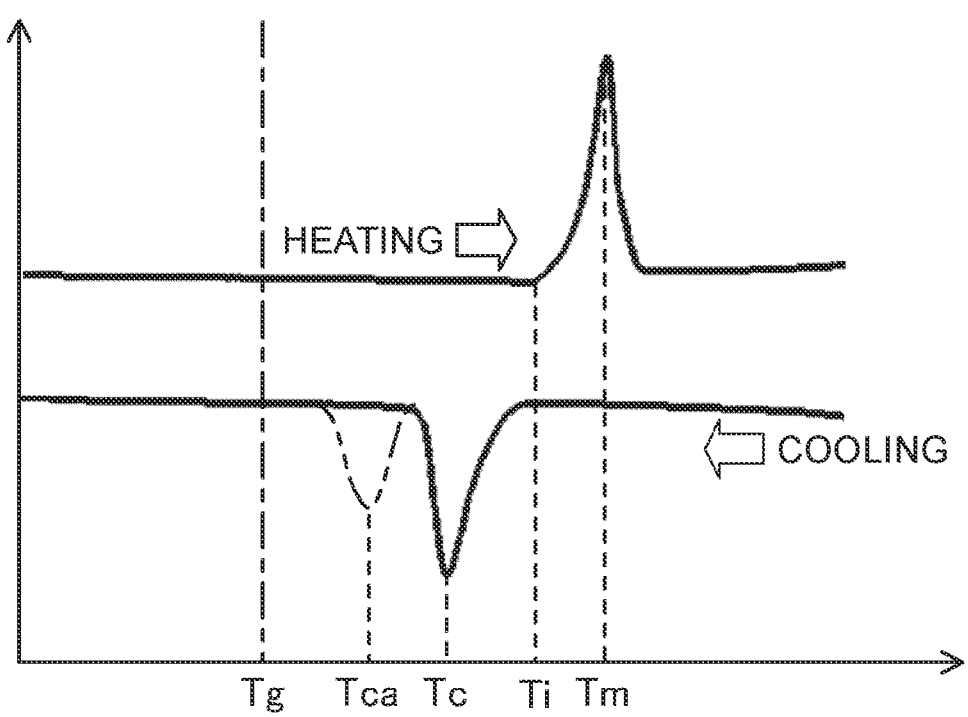
FIG. 7 is a diagram illustrating a method of selecting a crystalline resin and a non-crystalline resin.

<Selection Condition> Glass Transition Temperature Tg of Non-Crystalline Resin<Melting Starting Temperature Ti of Crystalline Resin FIG. 7 is a diagram illustrating a method of selecting a crystalline resin and a non-crystalline resin. In FIG. 7, a curve drawn with a solid line is a DSC curve showing a measurement result of differential scanning calorimetry (DSC) of the crystalline resin. A curve drawn with a two-dot chain line in FIG. 7 is a DSC curve showing a DSC measurement result of a polymer alloy where the crystalline resin is alloyed using the non-crystalline resin as an alloy material, and it shows a curve near a crystallization temperature Tca. In addition, a straight line drawn with a one-dot chain line in FIG. 7 shows a glass transition temperature Tg of the non-crystalline resin and the ordinate shows a change in tan δ (loss elastic modulus/storage elastic modulus) which is a ratio between storage elastic modulus and loss elastic modulus.

As shown in FIG. 7, the melting starting temperature Ti, melting point Tm, and crystallization temperatures Tc and Tca of the crystalline resin can be measured using a well-known differential scanning calorimeter. The melting starting temperature Ti refers to a temperature at which heat absorption due to melting starts in the DSC curve at the time of heating. For example, it can be defined as a value obtained as an extrapolation melting starting temperature from the DSC curve obtained by differential scanning calorimetry in accordance with JIS K 7121. The crystallization temperature refers to the temperature at the exothermic peak in the DSC curve at the time of cooling.

Considering that the electronic control device 100 is installed in an engine room of an automobile, it is preferable to select any of polybutylene terephthalate (PBT), polyamide 6 (PA6), polyamide 66 (PA66), polyamide 6T (PA6T), polyamide 9T (PA9T) and polyphenylene sulfide (PPS) as the crystalline resin from the viewpoints of heat resistance, chemical resistance and the like.

As the non-crystalline resin, it is preferable to select any of polystyrene (PS), acrylonitrile styrene (AS), polycarbonate (PC), acrylonitrile butadiene styrene copolymer (ABS), polymethyl methacrylate (PMMA), and cycloolefin polymer (COP). Polystyrene (PS) includes a high impact polystyrene (HIPS). The ratio of the non-crystalline resin which is an alloy material is desirable to be 5 to 40% by weight.

It is preferable to add glass fiber to the polymer alloy. By adding an inorganic material, heat resistance, rigidity and dimensional stability can be improved, and a difference in coefficient of linear expansion with metal can also be reduced. When the glass fiber to be added to the polymer alloy is less than 20% by weight, the effect of improving rigidity is small, and thus it is preferable to add 20% by weight or more of the glass fiber. When the glass fiber to be added to the polymer alloy is more than 40% by weight, moldability may deteriorate in some cases, and thus it is preferable to add 40% by weight or less of the glass fiber.

—Injection Molding Step—

In the injection molding step S120 shown in FIG. 6, the pellet-shaped polymer alloy obtained in the resin selection step S110 is heated and melted, and forms the resin molded body 1 by injection molding through an injection molding machine (not shown). For example, a nozzle of the injection molding machine is arranged at a position corresponding to the central portion of the cover 1a. The polymer alloy injected from an injection port of the nozzle spreads from the central portion to the periphery, and the cover 1a and the connector 1b are formed integrally.

—Assembly Preparation Step—

In the assembly preparation step S130, the resin molded body 1, the circuit substrate 5 on which the electronic component 6 is mounted, and the metal base 4 are prepared.

—Assembly Step—

In assembly step S140, the circuit substrate 5 on which the electronic component 6 is mounted is placed in the recessed portion 1c of the resin molded body 1, the terminal pin of the connector 1b and the circuit substrate 5 are soldered and bonded by spot flow (local soldering) and the like, and the connector 1b and the circuit substrate 5 are electrically connected. The circuit substrate 5 is fixed to the resin molded body 1 by an adhesive, heat caulking, screwing, etc. In a case of fixing using an adhesive, it is preferable to fix by using an ultraviolet curable adhesive or a two-liquid adhesive which is cured at room temperature, because in this way it is possible to shorten the time of the step (shortening tact time).

In order to have heat radiated efficiently from the metal base 4, a heat radiation material may be coated such that the heat radiation material is interposed between the metal base 4 and the circuit substrate 5. As the heat radiation material, for example, an epoxy-based or silicon-based thermosetting resin can be used. In this case, the heat radiation material can be cured by heat generated during the laser bonding which will be described later.

—Surface Modification Treatment Step—

In the surface modification treatment step S145, an atmospheric pressure plasma treatment is applied to the bonding surface of the resin molded body 1 and the metal base 4. Plasma is generated under the atmospheric pressure and plasma is irradiated towards the resin bonding surface 1d of the resin molded body 1 and the metal bonding surface 4d of the metal base 4 in the surface modification treatment step S145. In this way, an oxygen functional group is generated and increased in the resin bonding surface 1d, and the surface energy increases. When the atmospheric pressure plasma treatment is applied to the metal bonding surface 4d, the surface energy increases due to cleaning of the surface or a formation of a strong oxide film. The surface modification step may be conducted in any part as long as it is after the injection step and before the bonding. In addition, it is also effective to apply a triazine treatment or a chemical conversion treatment to the metal bonding surface 4d of the metal base 4, and it is preferable to form an oxide film of 1 μm or more. Since ADC 12 is easy to corrode, an alumite treatment is effective even during the chemical conversion treatment. When an alumite treatment is carried out up to a laser irradiation portion, not only the salt damage resistance can be improved, but also an absorption rate of laser beam can be increased, and thus it is effective for cost reduction of equipment and a high-speed bonding. When cost is given a priority, a trivalent chromium treatment is also effective, although its corrosion resistance is lower than the alumite treatment. In this case, similar to the alumite treatment, effects of cost reduction of equipment and a high-speed bonding can be expected.

—Laser Bonding Step—

During irradiation with the laser beam 10 in the laser bonding step S150, a laser beam source may be deteriorated when the laser beam source is irradiated with reflected light reflected on the surface of the metal base 4. Therefore, the laser beam 10 is irradiated diagonally such that the laser beam source is not irradiated with the reflected light of the laser beam 10. A case of laser irradiation in two steps is shown below.

The laser bonding step S150 includes a first pressurizing step S152, a first laser irradiation step S154, a second pressurizing step S156 and a second laser irradiation step S158. FIG. 8 is a perspective view schematically showing a procedure of scanning the laser beam 10 in a state where the metal base 4 is pressed against the resin molded body 1 by a pressing jig 190. A locus of the laser beam 10 is schematically shown by broken lines in FIG. 8.

FIG. 9 is a schematic cross-sectional view illustrating a bonding method according to the first embodiment. For convenience of explanation, X axis, Y axis and Z axis are defined as shown in FIG. 9. The X axis, the Y axis and the Z axis are orthogonal to each other. An X direction parallel to the X axis corresponds to a length direction of the electronic control device 100, and a Y direction parallel to the Y axis corresponds to a width direction of the electronic control device 100. A Z direction parallel to the Z axis corresponds to a thickness direction (height direction) of the electronic control device 100. A jig 31 arranged at the +X side end portion of the metal base 4 and the cover 1a, and at the side of +X side of the metal base 4 is shown in FIG. 9.

In the laser bonding step S150, first, the resin molded body 1 is placed on a placing stand (not shown) such that the resin bonding surface 1d faces upward, and the resin molded body 1 is fixed to the placing stand. The metal base 4 is arranged on the resin molded body 1 such that the metal bonding surface 4d of the metal base 4 is brought into contact with the resin bonding surface 1d of the resin molded body 1. A dimension in the X direction and a dimension in the Y direction of the resin molded body 1 are one size larger (for example, about 1 to 3 mm larger) than the metal base 4. The pressing jig 190 having a flat pressing surface is prepared.

As shown in FIG. 9 (a), the thickness of the outer peripheral portion of the metal base 4 is smaller than that of the central portion, and there is a step between the outer peripheral portion and the central portion. In other words, a stepped portion is provided in the outer peripheral portion of the metal base 4, the stepped portion being formed with an outer side with a thin portion having a small thickness with respect to a thick portion of an inner side. A main surface 101 which is a surface to be pressed against the resin bonding surface 1d is formed in the thin portion and is arranged to face the resin bonding surface 1d.

A predetermined gap is formed between the side surface of the recessed portion 1c of the resin molded body 1 and an inner side surface 112 of the metal base 4. By positioning the metal base 4 on the resin molded body 1, the recessed portion 1c of the resin molded body 1 is covered by the metal base 4, and a housing space S in which the circuit substrate 5 on which the electronic component 6 is mounted is arranged is defined by the recessed portion 1c of the resin molded body 1 and the metal base 4.

When the laser bonding step which will be described later is conducted, as shown in FIG. 9 (c), the metal base 4 and the resin molded body 1 are bonded and the housing space S becomes an enclosed space with high airtightness. The outer peripheral side surface of the metal base 4 includes an outer side surface 111 which is a side surface of the thin portion located between the main surface 101 and an outer side of the electronic control device 100, and an inner side surface 112 which is a side surface of the thick portion located between the main surface 101 and the housing space S. The outer side surface 111 and the inner side surface 112 respectively form the side surfaces of the metal base 4 continuous to the main surface 101, and form an angle of approximately 90 degrees with the main surface 101.

As shown in FIG. 9 (a), the metal jig 31 having an L-shaped cross section is used in the first embodiment. The jig 31 has, for example, a U shape in a plan view, and is arranged so as to surround the sides of the metal base 4 and the cover 1a. The jig 31 includes a side regulating portion 31s arranged with a predetermined interval (for example, about 1 mm) from the outer side surface 111 of the metal base 4, and an upper regulating portion 31u protruding from an upper end portion of the side regulating portion 31s to the center of the metal base 4. The side regulating portion 31s and the upper regulating portion 31u are portions regulating a deformation direction and deformation amount of the resin molded body 1. As will be described later, melted and deformed portions 21m and 22m of the resin molded body 1 are attached to the jig 31. Therefore, considering detachability from the resin, it is preferable to perform a surface treatment such as applying a heat-resistant coating of ceramics and the like and applying high hydrophobic Teflon (registered trademark) to the surface of the jig 31 such that the adhesion with the resin is lowered in advance.

—First Pressurizing Step—

As shown in FIG. 8 (a) and FIG. 9 (a), in the first pressurizing step S152, the pressing jig 190 is positioned such that the edge of the pressing jig 190 is positioned in the vicinity of the laser irradiation surface 11 along one side of the rectangular metal base 4, and the pressing jig 190 is brought into contact with the metal base 4 from above to press the metal base 4 downward. As a result, the main surface 101 which forms the metal bonding surface 4d of the metal base 4 and the resin bonding surface 1d of the resin molded body 1 are pressed into contact with each other. Since fine unevenness is formed on each of the metal bonding surface 4d and the resin bonding surface 1d, "the metal bonding surface 4d and the resin bonding surface 1d are pressed into contact with each other" does not mean that the resin bonding surface 1d and the metal bonding surface 4d are pressed into contact over the entire region, but includes that gaps are formed in apart. As the contact area of the pressing jig 190 with respect to the metal base 4 is increased, warping of the metal base 4 and decrease in adhesion between the metal base 4 and the resin molded body 1 can be inhibited. In the embodiment, the pressing jig 190 was pressed such that the maximum gap amount between the resin molded body 1 and the metal base 4 was about 20 μm.

—First Laser Irradiation Step—

The first laser irradiation step S154 is conducted in a state where the resin molded body 1 and the metal base 4 are pressed into contact with each other by the pressing jig 190. As shown in FIG. 8 (a), FIG. 9 (a) and FIG. 9 (b), in the first laser irradiation step S154, the laser irradiation surface 11 along one side of the rectangular metal base 4, i.e., a surface opposite to the main surface 101 which forms the metal bonding surface 4d, is irradiated with the laser beam 10, and as schematically shown by broken lines in FIG. 8 (a), the laser beam 10 is scanned in a straight line from a starting point (point A) to an ending point (point B) and the metal bonding surface 4d and the resin bonding surface 1d are bonded.

When the laser irradiation surface 11 is irradiated with the laser beam 10, the resin molded body 1 is heated via the metal base 4 and the temperature of the resin molded body 1 rises. As the temperature rises, the resin molded body 1 melts while expanding, and as shown in FIG. 9 (b), the melted and deformed portions 21m and 22m move outwardly while the outer peripheral portion of the metal base 4 is embedded in the resin molded body 1. The melted and deformed resin fills up the fine unevenness on the surface of the metal base 4 and is solidified, and in this way the metal base 4 and the resin molded body 1 are bonded. The metal base 4 does not melt, although the temperature of the metal base 4 also rises.

In the embodiment, the melted and deformed portion 21m is formed in a space surrounded by the jig 31 and the outer side surface 111 of the metal base 4, and the melted and deformed portion 22m is formed between the inner side surface 112 of the metal base 4 and the side surface of the recessed portion 1c of the resin molded body 1. The melted and deformed portion 21m is in contact with the outer side surface 111 of the metal base 4 and the jig 31, and the melted and deformed portion 22m is in contact with the inner side surface 112. For convenience of explanation, hatching is applied to each of the melted and deformed portions 21m and 22m schematically in FIG. 9.

The melted and deformed portion 21m is restricted from moving laterally by the side regulating portion 31s of the jig 31 and moves upward (+Z direction) along the outer side surface 111. That is, the melted and deformed portion 21m expands upward. The melted and deformed portion 21m which has expanded upward is restricted from moving upward by the upper regulating portion 31u of the jig 31 and moves in a direction (−X direction in the drawing) towards the center of the metal base 4 along the upper surface of the metal base 4. As shown in FIG. 9 (c), a laser irradiation mark (recess) 140 which is slightly recessed as compared with its surroundings is formed in the portion irradiated with the laser beam 10. The melted and deformed portions 21m and 22m are solidified as the temperature falls and becomes burrs adhered to the side surfaces of the metal base 4. That is, the burr is a portion where the melted and deformed portion of the resin molded body 1 is welded to the side surface of the metal base 4. The burr adhered to the outer side surface 111 of the metal base 4 is called an outer side burr 21c, and the burr adhered to the inner side surface 112 of the metal base 4 is called an inner side burr 22c. The outer side burr 21c is also adhered to the outer peripheral edge portion of the upper surface of the metal base 4. The orientation state of glass fiber of the outer side burr 21c and the orientation state of glass fiber of the inner side burr 22c are respectively different from the orientation state of glass fiber of the resin material located directly under the laser beam 10.

—Second Pressurizing Step—

As shown in FIG. 8 (b) and FIG. 9 (a), in the second pressurizing step S156, the pressing jig 190 is positioned such that the edge of the pressing jig 190 is positioned in the vicinity of the laser irradiation surface 11 along three sides of the rectangular metal base 4, and the pressing jig 190 is brought into contact with the metal base 4 from above to press the metal base 4 downward. As a result, the metal bonding surface 4d of the metal base 4 and the resin bonding surface 1d of the resin molded body 1 are pressed into contact with each other. The maximum gap amount between the resin molded body 1 and the metal base 4 is about 20 μm.

—Second Laser Irradiation Step—

The second laser irradiation step S158 is conducted in a state where the resin molded body 1 and the metal base 4 are pressed into contact with each other by the pressing jig 190. As shown in FIG. 8 (b), FIG. 9 (a) and FIG. 9 (b), in the second laser irradiation step S158, the laser irradiation surface 11 along three sides of the rectangular metal base 4 is irradiated with the laser beam 10, and as schematically shown by broken lines in FIG. 8 (b), the laser beam 10 is scanned in a substantially U shape from a starting point (point A) to an ending point (point B) and the metal bonding surface 4d and the resin bonding surface 1d are bonded. Similarly to the first laser irradiation step S154, the laser irradiation mark 140 is formed in the portion irradiated with the laser beam 10, the outer side burr 21c is adhered to the outer side surface 111 of the metal base 4, and the inner side burr 22c is adhered to the inner side surface 112 of the metal base 4.

In this way, the resin molded body 1 and the metal base 4 are bonded and the electronic control device 100 is completed. By scanning the laser beam 10 over the entire periphery of the rectangular laser irradiation surface 11 along four sides of the metal base 4, the laser bonding portion 11a is formed as schematically shown by the broken lines in FIG. 1. As a result, the housing space S which houses the circuit substrate 5 is sealed by the laser bonding portion 11a.

Since the starting point (point A) and the ending point (point B) are irradiated in both of the first laser irradiation step S154 and the second laser irradiation step S158, the heat input amount of the laser beam 10 tends to increase. Therefore, in order to equalize the heat input amount, the positions of the starting point (point A) and the ending point (point B) may be slightly shifted in each of the first laser irradiation step S154 and the second laser irradiation step S158.

In the laser bonding step S150, a series of steps of the first pressurizing step S152→the first laser irradiation step S154→the second pressurizing step S156→the second laser irradiation step S158 may be repeated a plurality of times.

As shown in FIG. 9 (c), the main surface 101 of the metal base 4 parallel to the XY plane is firmly bonded to the resin molded body 1 in the embodiment. The bonding portion in the main surface 101 is located directly under the laser irradiation surface 11, and thus the bonding strength is the highest. Further, the outer side surface 111 of the metal base 4 parallel to the YZ plane is adhered to the outer side burr 21c, and the inner side surface 112 of the metal base 4 parallel to the YZ plane is adhered to the inner side burr 22c.

In the embodiment, the outer side burr 21c adhered to the side surface of the metal base 4 is provided between the main surface 101 of the metal base 4 and an outer side of the electronic control device 100, and thus peeling of the cover 1a can be prevented over a long period of time. In the embodiment, a corroded substance is generated from the interface between the outer side burr 21c and the laser irradiation surface 11. Therefore, even if the generation of the corroded substance proceeds at the interface between the outer side burr 21c and the laser irradiation surface 11, the peeling force F is generated so as to peel the outer side burr 21c upward (+Z direction shown in the drawing), and thus it is possible to prevent occurrence of a large stress in the bonding portion of the main surface 101. Further, even in a state where the generation of the corroded substance proceeds to the interface between the outer side burr 21c and the outer side surface 111 and the peeling force F is generated so as to peel the outer side burr 21c outward (+X direction shown in the drawing), it is still possible to prevent occurrence of a large stress in the bonding portion of the main surface 101. As a result, a high bonding strength in the main surface 101 can be maintained over a long period of time.

The following effects can be obtained according to the first embodiment.

(1) The resin molded body 1 and the main surface 101 of the metal base 4 are bonded, and at least a part of a side surface (the outer side surface 111 and the inner side surface 112) continuous to the main surface 101 of the metal base 4 is in contact with a side contact portion (the outer side burr 21c and the inner side burr 22c) provided in the resin molded body 1. In this way, a high bonding strength can be maintained at the bonding portion in the main surface 101 over a long period of time when the electronic control device 100 formed by bonding the resin molded body 1 and the metal base 4 is placed in a salt damage environment, and thus separation of the resin molded body 1 and the metal base 4 can be inhibited. In other words, according to the embodiment, it is possible to provide the electronic control device 100 which can ensure airtightness over a long period of time even in a salt damage environment and has an improved life against salt damage.

(2) The method for manufacturing the electronic control device 100 according to the embodiment, the circuit substrate 5 on which the electronic component 6 is mounted is arranged in the housing space S defined by the resin molded body 1 and the metal base 4, the surface (the laser irradiation surface 11) opposite to the main surface 101 is irradiated with a laser beam in a state where the resin molded body 1 and the main surface 101 of the metal base 4 are pressed into contact with each other, and the resin molded body 1 is melted and deformed by heat from the laser beam and the melted and deformed portions 21m and 22m of the resin molded body 1 is brought into contact with a part of the side surface continuous to the main surface 101 of the metal base 4. In this way, the burrs 21c and 22c formed by solidifying the melted and deformed portions 21m and 22m can be brought into contact with a part of the side surface of the metal base 4 while the resin molded body 1 and the main surface 101 of the metal base 4 are firmly bonded, and productivity can be improved.

(3) Deformation of the resin molded body 1 is regulated by the jig 31 arranged with a predetermined interval from the outer side surface 111 of the metal base 4. In this way, in the laser bonding step S150, the melted and deformed portion 21m can be deformed along the outer peripheral surface of the metal base 4, and the melted and deformed portion 21m can be adhered to the outer side surface 111 of the metal base 4 easily. In the embodiment, by using the jig 31 having an L-shaped cross section, the deformation direction and deformation amount of the melted and deformed portion 21m are regulated such that the melted and deformed portion 21m rises along the outer side surface 111 of the metal base 4 and further moves along the upper surface of the metal base 4. In this way, the outer side burr 21c adhered to the side surface and the upper surface of the metal base 4 can be easily formed, and thus productivity can be improved.

(4) The housing space S housing the electronic component 6 is defined by the resin molded body 1 and the metal base 4. A stepped portion is provided in the outer peripheral portion of the metal base 4, the stepped portion being formed with the outer side with a thin portion having a small thickness with respect to a thick portion of the inner side. The main surface 101 of the metal base 4 is formed in the thin portion. The side surface of the metal base 4 includes the outer side surface 111 which is a side surface of the thin portion, and the inner side surface 112 which is a side surface of the thick portion. The side contact portion of the resin molded body 1 has the outer side burr 21c that contacts at least a part of the outer side surface 111, and the inner side burr 22c that contacts at least a part of the inner side surface 112. In this way, by providing not only the outer side burr 21c but also the inner side burr 22c, it is possible to further improve the life and enhance reliability of the electronic control device 100.

(5) The electronic control device 100 according to the embodiment is a laser bonded structure formed by laser bonding the resin molded body 1 and the metal base 4, and the laser irradiation mark 140 is formed by irradiating the laser irradiation surface 11 which is opposite to the main surface 101 with the laser beam 10. When the metal base 4 and the cover 1a are bonded by an adhesive with a high flexibility, the peeling force generated due to the generation of a corroded substance is absorbed by the adhesive with a high flexibility. In contrast, in the case of laser bonding, the influence of the peeling force generated due to the generation of the corroded substance to the bonding portion is greater as compared with the case of bonding with an adhesive with a high flexibility. Therefore, in the embodiment, the effect of inhibiting peeling by providing a burr in contact with the side surface of the metal base 4 is greater as compared with the case of bonding with an adhesive.

(6) The resin molded body 1 formed with a polymer alloy alloyed by containing a crystalline resin and a non-crystalline resin, and the metal base 4 formed with a metal are laser bonded to form the electronic control device 100. The crystalline resin and the non-crystalline resin are selected such that the glass transition temperature Tg of the non-crystalline resin is lower than the melting starting temperature Ti of the crystalline resin. Therefore, even when the gap amount between the resin bonding surface 1*d* and the metal bonding surface 4*d* in the entire laser scanning region varies, the gap amount between the resin bonding surface 1*d* and the metal bonding surface 4*d* is effectively reduced because of softening (decrease in elastic modulus) due to a temperature rise of the resin molded body 1 at the time of laser irradiation, and thus sufficient bonding strength can be ensured. As such, according to the embodiment, laser bonding strength can be improved as compared with the case where the resin molded body 1 is formed with a crystalline resin which is not alloyed. As a result, vibration resistance and impact resistance of the electronic control device 100 can be improved.

(7) A base material (crystalline resin) and an alloy material (non-crystalline resin) are selected such that the crystallization rate of the polymer alloy is lower than the crystallization rate of homo crystalline resin which is the base material of the polymer alloy, and by forming a polymer alloy containing both of the base material and the alloy material, it is possible to prolong the time for the melted resin to crystallize after laser irradiation as compared with the crystalline resin which is not alloyed. In this way, the laser bonding strength can be improved as compared with a laser bonded body of a metal body and a resin molded body formed with a crystalline resin which is not alloyed.

(8) A base material and an alloy material are selected such that the crystallization temperature Tca of the polymer alloy is lower than the crystallization temperature Tc of homo crystalline resin which is the base material of the polymer alloy, and by forming a polymer alloy containing both of the base material and the alloy material, it is possible to prolong the time for the melted resin to crystallize after laser irradiation as compared with the crystalline resin which is not alloyed. In this way, according to the embodiment, the laser bonding strength can be improved as compared with the case where the resin molded body 1 is formed with a crystalline resin which is not alloyed.

(9) The laser bonding strength can be greatly improved by performing a treatment (surface modification treatment) to increase the oxygen functional group on the bonding surface (the resin bonding surface 1*d*) of the resin molded body 1 with the metal base 4. (10) An oxide film of at least 1 μm or more is formed on the main surface 101 of the metal base 4. In this way, the salt damage resistance can be enhanced.

(11) When glass fiber is added to the polymer alloy, the rigidity of the resin molded body 1 can be improved and moreover, a long-term dimensional stability can be improved.

(12) The electronic control device 100 has an electronic circuit portion (the circuit substrate 5) which is housed in the housing space S defined by the metal base 4 and the resin molded body 1. Since the housing space S is sealed by laser bonding the resin molded body 1 and the metal base 4, waterproofness, dustproof property and rust prevention can be ensured. In other words, according to the embodiment, there is no need to seal using a liquid adhesive and the like.

When an adhesive is used as a sealing material, although the sealing material has good watertightness, it is easy to pass water vapor and has a characteristic of absorbing water, and thus the metal base 4 may be corroded. In addition, when a sealing material is used, the sealing property may be deteriorated due to voids contained in the sealing material. Furthermore, there is a problem of high cost when the sealing material is used in a large amount in order to prevent deterioration of the sealing property.

For automotive parts, mainly thermosetting adhesives are used as sealing materials. However, when a thermosetting adhesive is used, it takes 10 minutes or longer to heat and harden, and thus there is a problem of poor productivity. Moreover, there is a problem that voids are generated due to gas and the like generated during heating, and a yield worsens. In addition, it is necessary to ensure an area for coating the adhesive by controlling extrusions of the adhesive and the like, and thus there is also a problem of a restricted design flexibility.

In contrast, according to the embodiment, it is unnecessary to use a sealing material, and thus it is possible to ensure waterproofness, dustproof property and rust prevention over a long period of time as compared with a sealing material while preventing an increase in the number of manufacturing steps and an increase in cost without causing the above-mentioned problems.

(13) The resin molded body 1 is an integrally molded body in which the cover 1*a* covering the electronic circuit portion (the circuit substrate 5), and the connector 1*b* holding a terminal pin which is electrically connected to the electronic circuit portion (the circuit substrate 5) are integrally molded by injection molding. Cost reduction can be achieved by making the resin molded body 1 into an integrally molded body. In addition, in a case where an electronic control device is formed by combining a plurality of resin parts, a flatness in the resin bonding surface 1*d* may not be ensured due to the influence of assembly tolerance. In contrast, the resin molded body 1 is an integrally molded body in the embodiment, and thus a flatness necessary for laser bonding the metal bonding surface 4*d* and the resin bonding surface 1*d* can be easily ensured.

(14) In addition to an amount of sinking of the metal base 4, the height dimensions (Z direction dimensions) of the outer side burr 21*c* and the inner side burr 22*c* welded to the side surfaces of the metal base 4 can be used as an index in an inspection.

Second Embodiment

With reference to FIG. 10, an electronic control device according to the second embodiment will be described. FIG. 10 (*a*) and FIG. 10 (*b*) are schematic cross-sectional views illustrating a bonding method according to the second embodiment. Same reference signs are given to the parts the same as or corresponding to the parts in the first embodiment in the drawings and explanations thereof are omitted. Differences from the first embodiment will be described below in details.

It has been described in the first embodiment an example in which the jig 31 is used to regulate melt and deformation of the resin molded body 1 and form the outer side burr 21*c* when the laser beam 10 is irradiated and the resin molded body is melted and deformed. In contrast, in the second embodiment, a protruding portion 221 protruding upward from the resin bonding surface 1d is used in the resin molded body 1 to regulate melt and deformation of the resin molded body 1 during laser irradiation and form the outer side burr 21c between the protruding portion 221 and the outer side surface 111. The protruding portion 221 is arranged with a predetermined interval (for example, about 1 mm) from the outer side surface 111 of the metal base 4. As shown in FIG. 10 (b), the outer side burr 21c formed by solidifying the melted and deformed portion is sandwiched by the outer side surface 111 of the metal base 4 and the protruding portion 221.

As a result of a cross-sectional observation on the bonded structure according to the present embodiment, the orientation state of glass fiber contained in the resin of the protruding portion 221 provided in advance and the orientation state of glass fiber contained in the resin of the outer side burr 21c formed by solidifying the melted and deformed portion are different. Similarly, the orientation state of glass fiber contained in the resin of the protruding portion 221 and the orientation state of glass fiber contained in the resin of the inner side burr 22c formed by solidifying the melted and deformed portion are different.

According to the second embodiment described above, the following effects are achieved in addition to effects the same as that of the first embodiment.

(15) By positioning the protruding portion 221 at a position away from the outer side surface 111 with a predetermined distance, irradiating the metal base 4 with the laser beam 10 and melting and deforming the resin molded body 1, the outer side burr 21c can be formed between the protruding portion 221 and the outer side surface 111 to be sandwiched by the protruding portion 221 and the outer side surface 111. When the jig 31 is used, it is necessary to adjust the positions accurately or to clean periodically. However, according to the embodiment, it is not necessary to adjust the positions accurately or to clean periodically, and thus productivity can be further improved.

(16) Since the melted and deformed portion of the resin molded body 1 can be regulated by the protruding portion 221 of the resin molded body 1 which is the same part, not other parts, the position accuracy of the outer side burr 21c can be improved.

(17) The thermal conductivity of the protruding portion 221 is lower than that of the metal jig 31. Therefore, as compared with the first embodiment, it is easier to keep heat and gradually solidify in a cooling process, and thus the adhesion strength between the resin molded body 1 and the metal base 4 is improved.

Variation of the Second Embodiment

FIG. 10 (c) is a schematic cross-sectional view illustrating a bonding method according to a variation of the second embodiment. As shown in FIG. 10 (c), a sealing portion 231 which seals the outer edge of the contact interface between the outer side burr 21c of the resin molded body 1 and the metal base 4 is formed in the present variation. The sealing portion 231 can be formed by coating the outer edge of the contact interface between the outer side burr 21c of the resin molded body 1 and the metal base 4 with an adhesive after the laser bonding step S150.

In this way, the airtightness of the electronic control device 100 can be further improved. Since it is possible to use a type of adhesive which is cured by moisture as the adhesive and the using amount can be reduced, the reliability can be greatly improved while the influence of an increase in cost and a decrease in productivity can be diminished.

Third Embodiment

Figure 11:
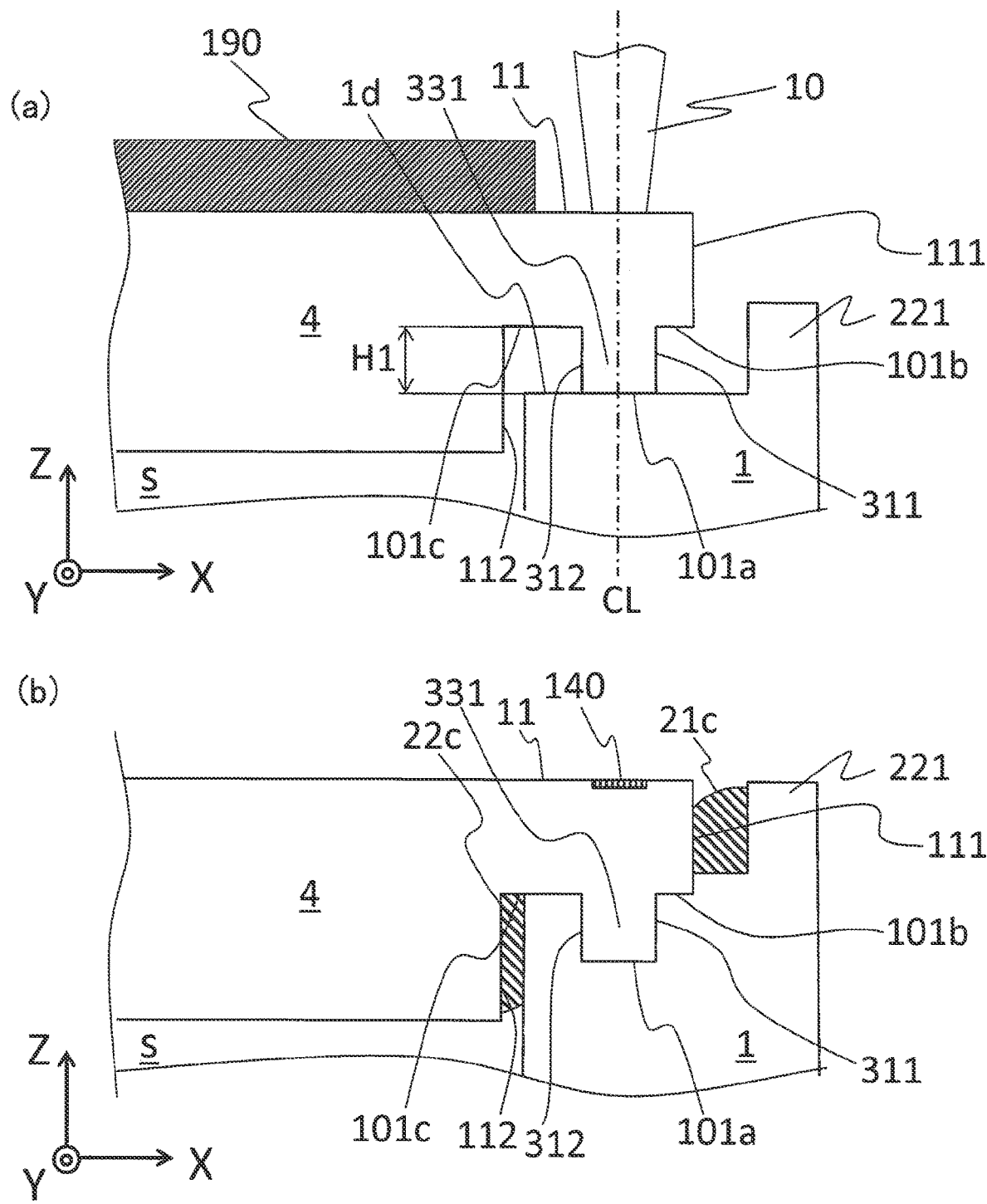
FIG. 11 is a schematic cross-sectional view illustrating a bonding method according to a third embodiment.

With reference to FIG. 11, an electronic control device according to the third embodiment will be described. FIG. 11 is a schematic cross-sectional view illustrating a bonding method according to the third embodiment. Same reference signs are given to the parts the same as or corresponding to the parts in the second embodiment in the drawing and explanations thereof are omitted. Differences from the second embodiment will be described below in details.

As shown in FIG. 11 (a), a first protruding portion 331 protruding from the thin portion towards the resin molded body 1 is provided on the outer peripheral portion of the metal base 4. The first protruding portion 331 has a protruding height H1 (a length from the thin portion to the top surface in the −Z direction) of about 1 mm to 3 mm. The first protruding portion 331 is formed along the outer peripheral portion of the metal base 4 and has a rectangular annular shape in a plan view. As shown in FIG. 11 (a), in the present embodiment, the main surface 101 facing the resin bonding surface 1d includes a top main surface 101a which forms the top surface of the first protruding portion 331, an outer side main surface 101b of the outer side of the first protruding portion 331, and an inner side main surface 101c of the inner side of the first protruding portion 331.

In the laser bonding step S150 in the third embodiment, as shown in FIG. 11 (a), the metal base 4 is irradiated with the laser beam 10 in a state where the top main surface 101a of the first protruding portion 331 is pressed against the resin molded body 1. Since the contact surface directly under the irradiation of the laser beam 10 has the highest bonding strength, it is desirable to irradiate the laser beam 10 onto a projection surface of the first protruding portion 331 on the laser irradiation surface 11 opposite to the top main surface 101a. In the embodiment, the laser beam 10 is irradiated such that the first protruding portion 331 is located on a central axis (optical axis) CL of the laser beam 10.

As shown in FIG. 11 (b), the laser bonding step S150 is conducted such that the entire first protruding portion 331 is embedded in the resin molded body 1. The laser irradiation mark 140 is formed in the portion irradiated with the laser beam 10 in the laser irradiation surface 11. The laser irradiation mark 140 overlaps with the first protruding portion 331 when it is projected in the protruding direction (−Z direction) of the first protruding portion 331. The first protruding portion 331 is buried in the resin molded body 1 and the resin molded body 1 is welded to the top surface and the side surface of the first protruding portion 331.

In the embodiment, the contact area As between the side surface of the metal base 4 and the resin molded body 1 is larger than the contact area Am between the main surface 101 of the metal base 4 and the resin molded body 1. The contact area As between the side surface of the metal base 4 and the resin molded body 1 is expressed by equation (1).

$$As = As1 + As2 + As3 + As4 \quad (1)$$

As1: Contact area between the inner side surface 112 of the metal base 4 and the resin molded body 1

As2: Contact area between an inner side surface 312 of the first protruding portion 331 of the metal base 4 and the resin molded body 1

As3: Contact area between an outer side surface 311 of the first protruding portion 331 of the metal base 4 and the resin molded body 1

As4: Contact area between the outer side surface 111 of the metal base 4 and the resin molded body 1

The contact area Am between the main surface 101 of the metal base 4 and the resin molded body 1 is expressed by equation (2).

$$Am=Am1+Am2+Am3 \qquad (2)$$

Am1: Contact area between the top main surface 101a of the first protruding portion 331 of the metal base 4 and the resin molded body 1

Am2: Contact area between the outer main surface 101b of the metal base 4 and the resin molded body 1

Am3: Contact area between the inner main surface 101c of the metal base 4 and the resin molded body 1

According to the third embodiment described above, the following effects are achieved in addition to effects the same as that of the second embodiment.

(18) The first protruding portion 331 protruding towards the resin molded body 1 is provided on the outer peripheral portion of the metal base 4 and the top main surface 101a of the first protruding portion 331 is pressed against the resin molded body 1. In this way, it is possible to reduce a pressing force required for the pressing jig 190.

(19) Since the first protruding portion 331 is provided on the central axis CL of the laser beam 10, the temperature of the first protruding portion 331 can be easily increased, and as shown in FIG. 11(b), a necessary embedding amount can be easily ensured. The laser irradiation mark 140 formed by irradiation with the laser beam 10 overlaps with the first protruding portion 331 when it is projected in the protruding direction of the first protruding portion 331.

(20) The peeling of the resin molded body 1 from the metal base 4 can be inhibited effectively by burying the first protruding portion 331 in the resin molded body 1. The embedding depth can be easily adjusted by adjusting the protruding height of the first protruding portion 331. Therefore, a high peeling prevention effect can be expected while the cost is controlled.

(21) The contact area As between the side surface of the metal base 4 and the resin molded body 1 is larger than the contact area Am between the main surface of the metal base 4 and the resin molded body 1. In this way, it is possible to effectively suppress a load due to the peeling force F generated by the generation of the corroded substance.

Variation 1 of the Third Embodiment

FIG. 12 is a schematic cross-sectional view illustrating a bonding method according to variation 1 of the third embodiment. As shown in FIG. 12 (a), a second protruding portion 332 is provided outside the first protruding portion 331 to surround the first protruding portion 331 in variation 1 of the third embodiment. Like the first protruding portion 331, the second protruding portion 332 protrudes towards the resin molded body 1 and has a rectangular annular shape in a plan view. The protruding height H2 (a length from the thin portion to the top surface in the -Z direction) of the second protruding portion 332 is smaller than the protruding height H1 of the first protruding portion 331.

In this way, by providing a plurality of protruding portions, it is possible to increase the contact area between the side surface of the metal base 4 and the resin molded body 1, and thus the life is further improved.

It is preferable to irradiate the laser beam 10 such that the first protruding portion 331 with a high protruding height is located on the central axis (optical axis) CL of the laser beam 10. Since the laser beam 10 is irradiated to the thick portion of the outer peripheral portion of the metal base 4, it is possible to prevent problems such as penetration of the outer peripheral portion of the metal base 4 by the laser beam 10. In the present variation, the laser irradiation mark 140 is only formed on the projection surface of the first protruding portion 331 as shown in FIG. 12 (b). In other words, the projection surface of the laser irradiation mark 140 does not overlap with the second protruding portion 332 when the laser irradiation mark 140 is projected in the protruding direction (-Z direction) of the second protruding portion 332.

In the variation, it is necessary to ensure a space to provide the second protruding portion 332 on the outer peripheral side of the first protruding portion 331, and thus the distance between the first protruding portion 331 and the outer side surface 111 is longer than that in the third embodiment. As a result, there is a possibility that the resin molded body 1 cannot be melted and deformed sufficiently to form the outer side burr 21c only by irradiating a region corresponding to the first protruding portion 331 with the laser beam 10. In this case, for example, by irradiating the projection surface of the first protruding portion 331 with the laser beam 10 a first time and irradiating the projection surface of the second protruding portion 332 with the laser beam 10 a second time, it is possible to raise the temperature of the resin molded body 1 in the vicinity of the outer edge of the metal base 4 and to form the outer side burr 21c with a sufficient size. In this case, a laser irradiation mark (not shown) formed by the irradiation with the laser beam 10 the second time does not overlap with the second protruding portion 332 when it is projected in the protruding direction of the second protruding portion 332. Examples of providing two kinds of protruding portions have been described in the variation; however, three or more kinds of protruding portions may be provided on the metal base 4.

Variation 2 of the Third Embodiment

It has been described above an example of arranging the pressing jig 190 in the central portion of the metal base 4 and pressurizing. However, the invention is not limited thereto. For example, as shown by a two-dot chain line in FIG. 13 (a), a pressing jig 390 may be arranged outside the outer end portion of the metal base 4, that is, outside the laser irradiation surface 11, and pressurized.

Variation 3 of the Third Embodiment

FIG. 13 (a) is a schematic cross-sectional view illustrating a bonding method according to variation 3 of the third embodiment, and FIG. 13 (b) is a schematic plan view of the metal base 4 according to variation 3 of the third embodiment. For convenience of explanation, the sizes of recesses 331p and 332p are exaggerated for illustration in FIG. 13 (a) and FIG. 13 (b).

As shown in FIG. 13 (a), in variation 3 of the third embodiment, a plurality of minute recesses 331p of about tens of μm are formed in the top portion of the first protruding portion 331, and a plurality of minute depressions 332p of about tens of μm are formed in the top portion of the second protruding portion 332. As shown in FIG. 13 (b), each of the depressions 331p is formed along the first protruding portion 331 and has a rectangular annular shape in a plan view. Similarly, each of the depressions 332p is formed along the second protruding portion 332 and has a rectangular annular shape in a plan view. Each of the depressions 331p and 332p is formed by laser processing in advance. Here, the rectangular annular shape means that each side may be linear or meandering smoothly.

A part of each of the recesses 331p may be connected to each other. However, when the recesses 331p are connected to each other, corrosion proceeds through the connected portions. It is also not preferable from the viewpoint of airtightness. Therefore, it is preferable to control the total area of the connected portions to, for example, 20% or less with respect to the total area of all the recesses 331p formed in the first protruding portion 331. For the recesses 332p, it is also preferable to control the area of the connected portions similarly.

Variation 4 of the Third Embodiment

FIG. 13 (c) is a schematic cross-sectional view illustrating a bonding method according to variation 4 of the third embodiment. As shown in FIG. 13 (c), an extending portion 341 may be formed by extending the outer peripheral portion of the metal base 4 laterally relative to variation 1 of the third embodiment (see FIG. 12). The extending portion 341 is arranged facing and close to the protruding portion 421 protruding upward in the outer peripheral portion of the resin molded body 1.

According to the variation, the outer side burr 21c can be made inconspicuous, and thus an appearance can be improved.

Fourth Embodiment

With reference to FIG. 14, an electronic control device according to the fourth embodiment will be described. FIG. 14 is a schematic cross-sectional view illustrating a bonding method according to the fourth embodiment. Same reference signs are given to the parts the same as or corresponding to the parts in the third embodiment in the drawing and explanations thereof are omitted. Differences from the third embodiment will be described below in details.

As shown in FIG. 14, in the fourth embodiment, a recessed groove 442 having a rectangular annular shape in a plan view is provided in an inner side of the rectangular annular first protruding portion 331 protruding towards the resin molded body 1 along the housing space S to recess upward (+Z direction). The resin molded body 1 is provided with a protruding portion 441 protruding towards the resin molded body 1 at a position facing the groove 442. The size of the protruding portion 441 is slightly smaller than the size of the groove 442. In the laser bonding step S150, when the metal base 4 is pressed against the resin molded body 1, the protruding portion 441 is loosely fitted in the groove 442 and a gap is formed between the protruding portion 441 and the groove 442.

When the laser beam 10 is irradiated and heat is applied to the resin molded body 1, the resin molded body 1 is melted and deformed, and the gap between the protruding portion 441 and the groove 442 is filled with the melted and deformed portion. When the melted and deformed portion is solidified, an intermediate burr 423c adhered to the groove 442 is formed.

According to the fourth embodiment described above, in addition to effects the same as that of the third embodiment, the life is further improved because the contact area between the side surface of the metal base 4 and the resin molded body 1 can be increased. The groove 442 is provided in an inner side relative to the laser irradiation mark 140 of the metal base 4. This makes it possible to inhibit dissipation of heat inward (−X direction) during the irradiation with the laser beam 10. In other words, heat generated by the laser beam 10 can be efficiently transmitted to the first protruding portion 331 with a low laser output. Therefore, the metal base 4 can be embedded in the resin molded body 1 with a low laser output.

It has been described in the embodiment an example in which one groove 442 is provided in the metal base 4. However, two or more grooves may be provided in the metal base 4.

Fifth Embodiment

With reference to FIG. 15 (a), an electronic control device according to the fifth embodiment will be described. FIG. 15 is a schematic cross-sectional view illustrating a bonding method according to the fifth embodiment. Same reference signs are given to the parts the same as or corresponding to the parts in the third embodiment in the drawing and explanations thereof are omitted. Differences from the third embodiment will be described below in details.

As shown in FIG. 15 (a), a third protruding portion 551 is provided outside the first protruding portion 331 so as to surround the first protruding portion 331 in the fifth embodiment. The third protruding portion 551 is a portion that sandwiches an outer side burr 521c with an outer peripheral surface 558 of the resin molded body 1. The third protruding portion 551 is arranged on the outer peripheral end portion of the metal base 4 and has a rectangular annular shape in a plan view. The third protruding portion 551 protrudes downward (−Z direction) along the outer peripheral surface 558 of the resin molded body 1. A gap is formed between the third protruding portion 551 and the outer peripheral surface 558 of the resin molded body 1 in an alignment step before irradiation with the laser beam 10. In the laser bonding step S150, the gap between the outer peripheral surface 558 of the resin molded body 1 and the third protruding portion 551 is filled with the melted and deformed portion, and the outer side burr 521c formed by solidifying the melted and deformed portion is adhered to the third protruding portion 551 of the metal base 4.

According to the fifth embodiment described above, the following effects are achieved in addition to effects the same as that of the third embodiment.

(22) It is possible to increase the contact area between the side surface of the metal base 4 and the resin molded body 1 to enhance the bonding strength by increasing the length of the third protruding portion 551 without increasing the thickness of the metal base 4, and thus the design flexibility is high.

(23) Since the outer peripheral portion of the metal base 4 extends laterally beyond the resin molded body 1, as shown by a two-dot chain line in FIG. 15 (a), it is easy to ensure a space to arrange the pressing jig 390 when the pressing jig 390 is arranged outside the laser irradiation surface 11 and is pressurized.

(24) The outer side burr 21c is hidden by the third protruding portion 551 when viewed from the side, and thus the appearance can be improved.

(25) The life can be further improved by adhering the inner side burr 522c not only to the side surface of the thick portion of the metal base 4 but also to a part of the inner surface (the surface at the housing space S side) of the thick portion.

Variation of the Fifth Embodiment

FIG. 15 (*b*) is a schematic cross-sectional view illustrating a bonding method according to a variation of the fifth embodiment. As shown in FIG. 15 (*b*), a groove 561 is formed in the base end portion of the third protruding portion 551 in the variation of the fifth embodiment. In the laser bonding step S150, the groove 561 is not entirely filled with the melted and deformed portion, and a space portion 561S is formed in the bottom portion of the groove 561.

In this way, in the variation of the fifth embodiment, the space portion 561S where salt water accumulates is intentionally provided in the bonding interface between the metal base 4 and the resin molded body 1, that is, on the way of invasion route of salt water during a salt damage test. In this way, the life can be further improved. When the size of the space portion 561S is small, it becomes a factor causing crevice corrosion. Therefore, it is preferable to ensure a distance of 0.5 mm or more from the bottom portion of the groove 561 to the outer side burr 521*c*.

The following variations are also within the scope of the invention, and the following variations, the above-described embodiments and variations thereof can be combined with each other.
(Variation 1)

It has been described in the above embodiment an example in which the cover 1*a* and the connector 1*b* are integrally molded by injection molding. However, the invention is not limited thereto. The cover 1*a* covering the circuit substrate 5 and the connector 1*b* holding the terminal pin (not shown) may be separated from each other. In this case, the connector 1*b* and the cover 1*a* may be bonded by various welding methods such as laser welding, ultrasonic welding, and hot plate welding, and may also be bonded by using an adhesive or a snap fit.

According to variation 1, since the cover 1*a* and the connector 1*b* are separated bodies (separated parts), the materials of the cover 1*a* and the connector 1*b* may be different. For example, for the connector 1*b* with a high flame retardancy requirement (grade and environmental regulations), a material in which a larger amount of flame retardant is blended than the cover 1*a* may be used. As a result, the material cost can be reduced as compared with the case where the cover 1*a* and the connector 1*b* are integrally molded to satisfy the requirement for flame retardancy.

In a case to increase the flame retardancy of the connector 1*b* as compared with the cover 1*a*, the type of alloy material contained in the polymer alloy forming the cover 1*a* and the type of alloy material contained in the polymer alloy forming the connector 1*b* may be different. In a case where the cover 1*a* and the connector 1*b* are bonded by welding and the PBT resin is used as a base material of each of the cover 1*a* and the connector 1*b*, it is known that it does not significantly affect the weldability of the cover 1*a* and the connector 1*b* even when a large amount of flame retardant is blended in the connector 1*b*.
(Variation 2)

It has been described in variation 1 an example in which the cover 1*a* and the connector 1*b* are bonded by welding and the like. However, the invention is not limited thereto. The cover 1*a* and the connector 1*b* may not be bonded. In this case, each of the cover 1*a* and the connector 1*b* is laser-bonded to the metal base 4. Either one of the cover 1*a* and the connector 1*b* may be laser-bonded to the metal base 4, and the other may be bonded to the metal base 4 with an adhesive, etc. Even in a case where laser bonding and an adhesive are used in combination, it is still possible to reduce the amount of the adhesive used as compared with the case where all parts are bonded with the adhesive.
(Variation 3)

In the above-described embodiment, the outer edge of the metal base 4 is scanned by one round by scanning the laser beam 10 in a straight line in the first laser irradiation step S154 and scanning the laser beam 10 in a U shape in the second laser irradiation step S158 (see FIG. 8). In other words, it has been described an example in which a process of scanning the laser irradiation surface 11 of the metal base 4 over the entire periphery is divided into two steps; however, the invention is not limited thereto. The laser beam 10 may be scanned over the entire periphery in one step.

For example, as shown in FIG. 12 (*a*), it is possible to scan the laser beam 10 over the entire periphery without dividing the steps by bringing the pressing jig 390 into contact with the outer end portions corresponding to the four sides of the metal base 4, pressing the metal base 4 against the resin molded body 1, and using a method of irradiating the laser beam 10 from a laser device having a galvano scanner. When the mirror of the galvano scanner is arranged directly above the center of the metal base 4, the laser beam 10 can be scanned in a rectangular shape. A laser device having a galvano scanner is suitable for manufacturing an electronic control device having a relatively small size.
(Variation 4)

In the pressurizing steps (S152, S156), the pressing jigs 190 and 390 may be heated with a heater, etc. and the metal base 4 may be pressurized in a heated state. In this case, by heating the resin molded body 1 to a temperature (for example, about 100° C.) equal to or higher than the glass transition temperature Tg of the alloy material, the embedding amount can be increased as compared with a case without heating. Considering heat resistance of the electronic component 6 mounted on the circuit substrate 5, 150° C. is the upper limit. It is preferable to perform laser bonding in a state where the resin molded body 1 has been heated to a temperature equal to or higher than the crystallization temperature of the polymer alloy and equal to or lower than the melting starting temperature of the polymer alloy. In this way, crystallization proceeds slowly after the laser bonding, and quenching after bonding can also be inhibited, and thus thermal stress can also be reduced. In addition, in the case of laser bonding in a state of being heated by a heat, etc., there is also a merit that laser energy required for laser bonding can be greatly reduced.
(Variation 5)

The pressing jigs 190 and 390 may be provided with a glass plate having high heat resistance and high transmittance that transmits the laser beam 10, and the laser irradiation surface 11 may be irradiated with the laser beam 10 via the glass plate.
(Variation 6)

It has been described in the above embodiment an example in which the laser irradiation surface 11 is provided on the metal base 4 and the metal base 4 is irradiated with the laser beam 10. However, the invention is not limited thereto. When the transmittance of the resin molded body 1 is high, the resin molded body 1 may be irradiated with the laser beam 10 and laser-bonded.
(Variation 7)

It has been described in the above embodiment an example in which both of the outer side burr 21*c* and the inner side burr 22c are provided. However, the invention is not limited thereto. In a case where salt water does not intrude into the bonding portion from the housing space S side such as the case where the housing space S is an enclosed space as described in the above embodiment, the inner side burr 22c may be omitted. As described above, even when the housing space S is an enclosed space, the contact area between the resin molded body 1 and the metal base 4 can be increased by providing the inner side burr 22c, and thus reliability can be improved.

(Variation 8)

It has been described in the above embodiment an example of using aluminum die casting (for example, JIS ADC 12) for the material of the metal base 4. However, the invention is not limited thereto. It is also possible to form the metal base 4 with various metals such as plated steel plate and stainless steel as long as the heat radiation property can be ensured.

(Variation 9)

It has been described in the above embodiment an example of atmospheric pressure plasma treatment as a treatment of generating and increasing oxygen functional groups on the resin side and a treatment of surface cleaning and forming a strong oxide film on the metal side. However, the invention is not limited thereto. A reduced pressure plasma treatment may be conducted instead of the atmospheric pressure plasma treatment. The atmospheric pressure plasma treatment is more effective than the reduced pressure plasma treatment in terms of productivity, while the reduced pressure plasma treatment is effective in that various gases can be imparted. In addition, instead of plasma treatment, for example, a dry treatment such as UV ozone, excimer laser, and short pulse irradiation may be conducted.

(Variation 10)

The surface modification treatment is preferably applied to at least the resin bonding surface 1d of the resin molded body 1, and more preferably applied further to the metal bonding surface 4d of the metal base 4. The effect is great even when the surface modification treatment is applied only to the resin side or the metal side.

(Variation 11)

The angles and shapes of the protruding portions 221, 421, 441, the protruding portions 331, 332 and the groove 442 described in the above embodiment may be set freely.

(Variation 12)

It has been described in the above embodiment an example in which glass fiber is added to the polymer alloy. However, the invention is not limited thereto. In order to improve the rigidity of the polymer alloy, various inorganic fillers made of inorganic substances may be added. For example, glass flake, glasses with special shapes and the like may be added instead of glass fiber. Carbon fiber may also be added instead of glass fiber. This makes it possible to improve electromagnetic wave shielding property in addition to the rigidity improvement. Conductive carbon (for example, Ketjen black, acetylene black, carbon beads, graphite, etc.) may be used as an inorganic filler capable of improving the electromagnetic wave shielding property. The case where an inorganic filler is not added to the polymer alloy is also within the scope of the invention.

(Variation 13)

Various additives, for example, stabilizers such as an antioxidant, an ultraviolet absorber, a heat stabilizer and an antistatic agent, a crystal nucleating agent, a plasticizer, a lubricant and the like may be added to the polymer alloy which is the material of the resin molded body 1. The content of the additive is preferably set to an extent that does not impair the effect of improving the bonding strength.

The PBT resin has an easily hydrolysable property. Therefore, when the PBT resin is used for the base material of the polymer alloy, it is preferable to add an additive (for example, an epoxy resin) which inhibits hydrolysis. Particularly, when PC alloy or PET alloy containing ester is used, hydrolyzability is comparable to PBT, and thus it is preferable to add an additive which inhibits hydrolysis. In addition, when PC alloy or PET alloy containing ester is used, transesterification may proceed excessively, which may lower productivity and lower the physical properties of the molded body. Therefore, when PC alloy or PET alloy containing ester is used, it is effective to add a transesterification terminator (for example, phosphorus compound). Further, a flame retardant (for example, phosphorus-based, bromine-based, etc.) or a flame retardant aid (such as antimony trioxide) may be added according to the requirement of flame retardancy.

(Variation 14)

It has been described in the above embodiment an example in which the metal base 4 is formed in a rectangular flat plate shape and the recessed portion 1c is formed in the resin molded body 1. However, the invention is not limited thereto. For example, a recessed portion housing the circuit substrate 5 may be provided in the metal base 4, and the resin molded body 1 may be in a flat plate shape.

(Variation 15)

It has been described in the above embodiment an example in which the invention is applied to the electronic control device 100 as an engine controller installed in an automobile. However, the invention is not limited thereto. The invention can be applied to various electronic control devices having a bonding structure in which a resin molded body and a metal body are bonded.

(Variation 16)

It has been described in the above embodiment an example in which the resin molded body 1 is formed with a polymer alloy. However, the invention is not limited thereto. For example, the resin molded body 1 may be formed with PBT resin (non-alloy).

(Variation 17)

The above-described manufacturing method of the electronic control device 100 is merely an example, and the electronic control device 100 can be manufactured by various manufacturing methods. For example, it has been described in the above embodiment an example in which the metal base 4 is bonded to the resin molded body 1 after arranging and fixing the circuit substrate 5 in the recessed portion 1c of the resin molded body 1 in the assembly step S140. However, the invention is not limited thereto. The resin molded body 1 may be bonded to the metal base 4 after arranging and fixing the circuit substrate 5 on the metal base 4.

(Variation 18)

It has been described in the above embodiment an example in which the maximum gap amount between the resin molded body 1 and the metal base 4 is about 20 μm. However, the invention is not limited thereto. The bonding strength decreases as the gap amount between the resin molded body 1 and the metal base 4 increases, and thus it is desirable to reduce the gap amount as much as possible. When the gap amount is more than 100 μm, the resin molded body 1 and the metal base 4 cannot be laser-bonded. Therefore, the gap amount needs to be 100 μm or less. However, when the gap amount is 100 μm or less while more than 50 μm, many voids remain in the laser bonding portion 11a due to thermal decomposition of the resin molded body 1, and thus it is difficult to maintain the bonding strength for a long period of time. For this reason, it is preferable to reduce the gap amount as much as possible in a state where the resin molded body 1 and the metal base 4 are pressurized, and a gap amount of 50 μm or less is preferable.

(Variation 19)

It has been described in the above embodiment an example in which the resin molded body 1 and the metal base 4 are bonded by the laser beam 10. However, the invention is not limited thereto. The invention can also be applied to a case where the resin molded body 1 and the metal base 4 are bonded by pressurized thermal bonding, vibration bonding, or ultrasonic bonding. An adhesive having good moisture resistance and salt damage resistance may achieve the same effect. In particular, in a case of an adhesive having good moisture resistance, it may become an adhesive having a high crosslink density, that is, a high elastic modulus. When the resin molded body 1 and the metal base 4 are bonded by an adhesive, the higher elastic modulus the adhesive has, that is, the harder the adhesive to deform, the more remarkable effect of the invention can be obtained. When the resin molded body 1 and the metal base 4 are bonded by an adhesive, instead of the outer side burr 21c and the inner side burr 22c, a side contact portion having the same function is formed in advance and the side contact portion is adhered to the side surface of the metal base 4 by an adhesive. Alternatively, the metal base 4 may be press-fitted into a side contact portion formed in a rectangular frame shape along the outer periphery of the resin molded body 1. Since it is possible to reduce the total amount of the adhesive used in the electronic control device 100, to reduce the cost and improve productivity by laser bonding, the resin molded body 1 and the metal base 4 are preferably laser-bonded. In addition, since the outer side burr 21c and the inner side burr 22c having the functions as the side contact portions in contact with the side surfaces of the metal base 4 can be formed during the laser bonding step and welded to the side surfaces of the metal base 4, it is also preferable to bond the resin molded body 1 and the metal base 4 by laser bonding from the viewpoint of productivity and adhesion.

(Variation 20)

When the surface roughness of the metal base 4 is increased, the effect of improving the bonding strength with the resin molded body 1, in which a resin containing an ester similar to PBT resin, such as PC resin or PET resin, is used as an alloy material, becomes greater. It is considered that this is because the slower the crystallization rate is, the greater the effect of improving the adhesion is. Therefore, it is effective to slow the crystallization rate and improve the bonding strength by using PBT copolymer in combination to an extent that the formability is not deteriorated. However, the formability would be greatly deteriorated when a non-crystalline resin is alloyed to PBT copolymer monomer alone, and thus it is effective to use PBT copolymer in combination.

As long as the features of the invention are not impaired, the invention is not limited to the above embodiments, and other forms considered within the technical ideas of the invention are also included in the scope of the invention.

The disclosed content of the following priority application is incorporated by reference herein.

Japanese patent application JP 2015-233565 (filed on Nov. 30, 2015)

REFERENCE SIGNS LIST

1 Resin molded body, 1a Cover, 1b Connector, 1c Recessed portion, 1d Resin bonding surface, 4 Metal base, 4a Connecting portion, 4d Metal bonding surface, 5 Circuit substrate, 6 Electronic component, 7 Cooling fin, 10 Laser beam, 11 Laser irradiation surface, 11a Laser bonding portion, 21c Outer side burr, 22c Inner side burr, 31 Jig, 31s Side regulating portion, 31u Upper regulating portion, 100 Electronic control device, 101 Main surface, 101a Top main surface, 101b Outer main surface, 101c Inner main surface, 111 Outer side surface, 112 Inner side surface, 140 Laser irradiation mark, 190 Pressing jig, 204 Input and output port, 205 Input circuit, 206 Ignition output circuit, 207 Injection valve drive circuit, 208 Ignition plug, 209 Fuel injection valve, 221 Protruding portion, 231 Sealing portion, 311 Outer side surface, 312 Inner side surface, 331 First protruding portion, 332 Second protruding portion, 341 Extending portion, 390 Pressing jig, 421 Protruding portion, 423c Intermediate burr, 441 Protruding portion, 442 Groove, 521c Outer side burr, 522c Inner side burr, 551 Third protruding portion, 558 Outer peripheral surface, 561 Groove, 561S Space portion

The invention claimed is:

1. An electronic control device, comprising:
a resin molded body;
a metal body; and
an electronic component,
wherein the resin molded body and a main surface of the metal body are bonded,
wherein a housing space housing the electronic component is defined by the resin molded body and the metal body,
wherein a stepped portion is provided in an outer peripheral portion of the metal body, the stepped portion having an outer side with a thin portion having a small thickness with respect to a thick portion of an inner side,
wherein the main surface of the metal body is formed in the thin portion,
wherein a side contact portion of the resin molded body has an outer side contact portion that contacts at least a part of a side surface of the thin portion, and an inner side contact portion that contacts at least a part of a side surface of the thick portion.

2. The electronic control device according to claim 1, wherein
the resin molded body is provided with a protruding portion that sandwiches the outer side contact portion with at least the part of the side surface of the thin portion of the metal body, and
wherein an orientation of the outer side contact portion is different from tho an orientation of the protruding portion.

3. The electronic control device according to claim 1, wherein
the metal body is provided with at least one or more protruding portions protruding towards the resin molded body, and
the protruding portion is buried in the resin molded body.

4. The electronic control device according to claim 1, wherein
the metal body has an annular protruding portion protruding towards the resin molded body and an annular groove recessed inside of the protruding portion along the housing space.

5. The electronic control device according to claim 1, wherein the resin molded body is a polymer alloy alloyed by containing a crystalline resin and a non-crystalline resin, and a glass transition temperature of the non-crystalline resin is lower than a melting starting temperature of the crystalline resin.

6. The electronic control device according to claim 5, wherein a crystallization rate of the polymer alloy is lower than a crystallization rate of homo crystalline resin, or a crystallization temperature of the polymer alloy is lower than a crystallization temperature of homo crystalline resin.

7. The electronic control device according to claim 1, wherein an oxide film of at least 1 μm or more is formed on the main surface of the metal body.

8. The electronic control device according to claim 1, wherein a sealing portion which seals an outer edge of a contact interface between the outer side contact portion of the resin molded body and at least the part of the side surface of the thin portion of the metal body is disposed.

* * * * *